United States Patent
Chung

(10) Patent No.: US 7,535,715 B2
(45) Date of Patent: May 19, 2009

(54) CONFORMABLE INTERFACE MATERIALS FOR IMPROVING THERMAL CONTACTS

(75) Inventor: Deborah Duen Ling Chung, E. Amherst, NY (US)

(73) Assignee: Deborah D. L. Chung, E. Amherst, NY (US)

( * ) Notice: Subject to any disclaimer, the term of this patent is extended or adjusted under 35 U.S.C. 154(b) by 0 days.

(21) Appl. No.: 11/427,150

(22) Filed: Jun. 28, 2006

(65) Prior Publication Data

US 2006/0246276 A1 Nov. 2, 2006

Related U.S. Application Data

(63) Continuation-in-part of application No. 10/807,487, filed on Mar. 23, 2004, now abandoned.

(60) Provisional application No. 60/485,804, filed on Jul. 9, 2003.

(51) Int. Cl.
*H05K 7/20* (2006.01)

(52) U.S. Cl. ............... 361/707; 361/704; 361/705; 361/708

(58) Field of Classification Search ............. 428/407, 428/114, 403, 323; 361/704–708
See application file for complete search history.

(56) References Cited

U.S. PATENT DOCUMENTS 4,568,592 A * 2/1986 Kawaguchi et al. ......... 428/107
4,842,911 A * 6/1989 Fick .......................... 428/40.4

(Continued)

FOREIGN PATENT DOCUMENTS

CN 1517426 8/2004

(Continued)

OTHER PUBLICATIONS

Yunsheng, Xu, Xiangcheng Luo and D.D.L. Chung, Lithium doped polyethylene-glycol-based thermal interface pastes for high thermal contact conductance, Transactions of ASME—Journal of Electronic Packing, Sep. 2002, p. 188-191, vol. 124, American Society of Mechanical Engineers, New York, NY, USA. Table 1.

(Continued)

*Primary Examiner*—Cathy Lam

(57) ABSTRACT

A conformable paste comprising porous agglomerates of carbon black dispersed in a paste-forming vehicle is disclosed. The paste is useful as an interface material for improving the thermal contact between two proximate solid surfaces, such as the surfaces of a heat source and a heat sink. Upon compression between the two solid surfaces, the paste forms a material that enhances the thermal contact between said surfaces. This invention also discloses a conformable interface material which, upon compression between two proximate solid surfaces, forms a material that enhances the thermal contact between said surfaces. This interface material comprises (i) a sheet and (ii) a conformable, spreadable and thermally conductive paste on each of the two opposite sides of the sheet, said paste comprising porous agglomerates of carbon black dispersed in a paste-forming vehicle. In addition, a method of providing a thermal contact between two solid surfaces is disclosed. This method comprises disposing between and in contact with said surfaces a material comprising: a conformable, spreadable and thermally conductive paste comprising porous agglomerates of carbon black dispersed in a paste-forming vehicle, and applying a pressure to cause said material to conform to the topography of said surfaces.

20 Claims, 13 Drawing Sheets

U.S. PATENT DOCUMENTS

| | | | | |
|---|---|---|---|---|
| 4,852,646 | A | * | 8/1989 | Dittmer et al. ............... 165/185 |
| 4,869,954 | A | * | 9/1989 | Squitieri ..................... 442/13 |
| 5,098,609 | A | * | 3/1992 | Iruvanti et al. .............. 252/511 |
| 5,523,049 | A | * | 6/1996 | Terpstra et al. ................ 419/36 |
| 5,591,034 | A | * | 1/1997 | Ameen et al. ................. 439/91 |
| 5,660,917 | A | * | 8/1997 | Fujimori et al. .......... 428/195.1 |
| 5,738,936 | A | * | 4/1998 | Hanrahan ................ 428/313.5 |
| 5,945,217 | A | * | 8/1999 | Hanrahan .................... 428/389 |
| 5,950,066 | A | * | 9/1999 | Hanson et al. .............. 428/551 |
| 6,165,612 | A | * | 12/2000 | Misra ......................... 428/344 |
| 6,472,742 | B1 | | 10/2002 | Bhatia |
| 6,475,962 | B1 | | 11/2002 | Khatri |
| 6,610,387 | B1 | * | 8/2003 | Torii et al. ............... 428/195.1 |
| 6,835,453 | B2 | * | 12/2004 | Greenwood et al. ......... 428/343 |
| 6,947,285 | B2 | * | 9/2005 | Chen et al. ................... 361/708 |
| 2003/0171487 | A1 | | 9/2003 | Ellsworth |
| 2004/0018945 | A1 | | 1/2004 | Khatri |
| 2004/0060691 | A1 | | 4/2004 | Chiu et al. |
| 2004/0081843 | A1 | | 4/2004 | Bunyan |
| 2004/0097635 | A1 | | 5/2004 | Fan et al. |
| 2004/0184241 | A1 | | 9/2004 | De Lorenzo |
| 2004/0241410 | A1 | | 12/2004 | Fischer |
| 2005/0150887 | A1 | | 7/2005 | Taya |
| 2005/0175838 | A1 | | 8/2005 | Greinke |
| 2005/0255304 | A1 | | 11/2005 | Brink |
| 2006/0073332 | A1 | | 4/2006 | Huang et al. |
| 2006/0118791 | A1 | | 6/2006 | Leu et al. |

FOREIGN PATENT DOCUMENTS

| | | |
|---|---|---|
| CN | 1632040 | 6/2005 |
| CN | 1667821 | 9/2005 |
| CN | 1715360 | 1/2006 |
| WO | PCT WO 9741599 | 11/1997 |
| WO | PCT WO 2001021393 | 3/2001 |
| WO | PCT WO 2005031864 | 4/2005 |
| WO | PCT WO 2005053021 | 6/2005 |
| WO | PCT WO 20060488848 | 5/2006 |

OTHER PUBLICATIONS

Yunsheng Xu, Xiangcheng Luo and D.D.L. Chung, Sodium silicate based thermal interface material for high thermal contact conductance, Transactions of ASME—Journal of Electronic Packaging, Jun. 2000, p. 128-131, vol. 122, American Society of Mechanical Engineers, New York, NY, USA. Table 1.

Xiangcheng Luo and D.D.L. Chung, Flexible graphite under repeated compression studied by electrical resistance measurements, Carbon, 2001, p. 985-990, vol. 39, Issue 7, Elsevier, Oxford, England. Abstract.

D.D.L. Chung, Exfoliation of graphite, Journal of Materials Science, 1987, p. 4190-4198, vol. 22, Issue 12, Springer, Netherlands. Abstract.

E.E. Marotta, S.J. Mazzuca and Julian Norley, Thermal joint conductance for flexible graphite materials: analytical and experimental study. IEEE Transactions on Components and Packaging Technologies, 2005, p. 102-110, vol. 28, Issue 1, Institute of Electrical and Electronics Engineers, Piscataway, NJ, USA. Abstract.

K. Zhang, Study on thermal interface material with carbon nanotubes and carbon black in high-brightness LED packaging with flip-chip technology. Proceedings—Electronics Components & Technology Conference (2005), 55th (vol. 1). p. 60-65. Institute of Electrical and Electronics Engineers. Abstract.

C.A. Frysz, Xiaoping Shui and D.D.L. Chung, Carbon filaments and carbon black as a conductive additive to the manganese dioxide cathode of a lithium electrolytic cell. Journal of Power Sources, 1996, p. 41-54, vol. 58, Issue 1, Elsevier. Abstract.

Weiming Lu and D.D.L. Chung, A comparative study of carbons for use as an electrically conducting additive in the manganese dioxide cathode of an electrochemical cell. Carbon, 2002, p. 447-449, vol. 40, Issue ER3, Elsevier, Oxford, England. Abstract.

Xiangcheng Luo and D.D.L. Chung, Effect of the thickness of a thermal interface material (solder) on heat transfer between copper surfaces. International Journal of Microcircuits and Electronic Packaging, 2001, p. 141-147, vol. 24, Issue 2, International Microelectronics and Packaging Society, Washington, D.C., USA. Abstract.

* cited by examiner

CONFORMABLE INTERFACE MATERIALS FOR IMPROVING THERMAL CONTACTS

This application is a continuation-in-part of U.S. patent application Ser. No. 10/807,487. It claims the benefit of (i) U.S. Provisional Patent Application Ser. No. 60/485,804, filed on Jul. 9, 2003, (ii) U.S. patent application Ser. No. 10/807,487, filed on Mar. 23, 2004, (iii) Patent Cooperation Treaty (PCT) WO2005/006403 A2 (International Application No. PCT/US2004/021734), filed on Jul. 7, 2004, and (iv) People's Republic of China Patent Application No. 200480019459.0, filed on Jan. 9, 2006, all of which are hereby incorporated by reference in their entirety.

FIELD OF THE INVENTION

This invention relates to conformable interface materials for improving thermal contacts. In particular, it relates to conformable, spreadable and thermally conductive pastes.

BACKGROUND OF THE INVENTION

With the miniaturization and increasing power of microelectronics, heat dissipation has become critical to the performance, reliability and further miniaturization of microelectronics. Heat dissipation from microelectronics is most commonly performed by thermal conduction. For this purpose, a heat sink, which is a material of high thermal conductivity, is commonly used. In order for the heat sink to be well utilized, the thermal contact between the heat sink and the heat source (e.g., a substrate with a semiconductor chip on it) should be good.

The proximate surfaces involved in a thermal contact are never perfectly flat. There are hills and valleys in the surface topography, thus resulting in air pockets, which are thermally insulating, at the interface. Since air is a thermal insulator, it is important to displace the air by using an interface material that conforms to the topography of the mating surfaces. Therefore, conformability is an essential attribute of a thermal contact enhancing interface material, which is also known as a thermal interface material. The importance of conformability is mentioned in PCT Int. Appl. WO 9741599 (1997).

A thermal interface material that is thick (i.e., the thickness above about 50 μm, typically above about 100 μm) is needed for filling the gap between the two proximate surfaces, in case that the surfaces are not in direct contact (as encountered when each surface is curved, so that gaps exist at parts of the interface, or when the two surfaces are not exactly parallel). This category of thermal interface materials is known as gap filling materials. They are to be distinguished from thermal interface materials that are thin (i.e., the thickness below about 100 μm, typically below about 50 μm)—ideally just thick enough to fill the valleys in the topography of the mating surfaces.

The thin type of thermal interface material is mainly in the form of a paste, which is known as a thermal paste. This paste comprises a base medium (i.e., the vehicle) and a filler that is thermally conductive. The filler is typically in the form of particles, as it is more difficult to make a workable paste that contains fibers (discontinuous) instead of particles.

The workability relates to the conformability, although the type of conformability required for a thermal paste is conformability to the surface topography in a fine (microscopic) scale, so that the extent of flow associated with conforming is small (Xu, Luo and Chung, *J. Electron. Packaging* 124, 188-191 (2002), which is hereby incorporated by reference in its entirety). In contrast, workability usually refers to the ability to flow or deform in a relatively coarse scale. Conformability in a fine scale is more challenging than that in a coarse scale. The viscosity, which is a measure of the resistance to flow, is commonly used to describe the rheology of pastes. However, akin to the workability, the viscosity relates to the ability to flow in a relatively coarse scale.

For any thermal interface material, the thicker it is, the more is the thermal resistance that it gives. Thus, a small thickness (ideally just enough to fill the valleys at the interface) is also important for a thermal interface material. For a thermal paste, a small thickness can be attained if the paste is highly spreadable. Hence, spreadability is the second criterion. The importance of spreadability is mentioned in U.S. Pat. Appl. Publ. US 20040060691 (2004).

A thermal paste is preferably thermally conductive, in addition to being conformable and spreadable. In fact, it is customary in the prior art to include in the formulation of thermal interface materials constituents that are high in thermal conductivity for the purpose of maximizing the thermal conductivity of the thermal interface materials.

Examples of constituents of high thermal conductivity are metal particles (e.g., nickel particles, zinc particles, copper particles, aluminum particles, silver particles, etc.), ceramic particles (e.g., boron nitride particles, zinc oxide particles, aluminum nitride particles, etc.) and diamond particles. Among these materials, diamond is the most conductive thermally.

Graphite, diamond and fullerenes are three categories of elemental carbon. Graphite and diamond differ in their chemical bonding, crystal structure, electrical conductivity and thermal conductivity. Graphite has a hexagonal crystal structure, whereas diamond has a cubic crystal structure. The carbon atoms in graphite are $sp^2$ hybridized in their chemical bonding, whereas those in diamond are $sp^3$ hybridized. In other words, the chemical bonding in graphite is partly metallic and partly covalent, whereas that in diamond is totally covalent. Graphite is an electrical conductor as well as a thermal conductor, whereas diamond is an electrical insulator and an exceptional thermal conductor. The thermal conductivity of diamond is much higher than that of graphite. Fullerenes are different from both graphite and diamond in that they are in the form of molecules. The most common form of carbon is in the graphite category. Although ideal graphite is completely crystalline in its structure, carbons in the graphite category can have various degrees of crystallinity. The higher is the degree of crystallinity, the higher is the thermal conductivity. Irrespective of the degree of crystallinity, the chemical bonding in carbons in the graphite category involves $sp^2$ hybridization.

Carbon black is a carbon in the graphite category. It can be partially crystalline, in contrast to ideal graphite (referred to as graphite), which is completely crystalline. Due to the low degree of crystallinity, carbon black is low in thermal conductivity compared to ideal graphite. However, carbon black is one of the most inexpensive forms of carbon, as it is akin to soot.

Faming Zhuanli Shenqing Gongkai Shuomingshu CN 1715360 (2006) is a Chinese patent filed on Jun. 30, 2004, which is after the priority date of Jul. 9, 2003 of this application and is also after the inventor's first journal publication (Leong and Chung, *Carbon* 41(13), 2459-2469 (2003)) that discloses the present invention in the form filed on Jul. 9, 2003. This Chinese patent mentions the use of carbon black particles (1-5%) as a ductile additional filler in a thermal interface material that contains particles of high thermal conductivity. Carbon black is not listed as one of the choices of particles of high thermal conductivity in this Chinese patent.

Faming Zhuanli Shenqing Gongkai Shuomingshu CN 1715360 (2006) distinguishes carbon black from carbon nanospheres, and recommends carbon nanospheres (not carbon black) to be one of the choices of thermally conductive particles. Similarly, in Faming Zhuanli Gongkai Shuomingshu CN 1517426 (2004), carbon nanoballs are recommended for serving as thermally conductive particles in formulating a thermal interface material.

Due to its structure, a multiwalled carbon nanotube is thermally conductive along the axis of each nanotube. The level of thermal conductivity depends on the degree of crystallographic order in the nanotube. The higher is degree of crystallographic order, the greater is the thermal conductivity. The thermal conductivity and the high aspect ratio (i.e., the ratio of the length to the diameter) of a nanotube are attributes which make the nanotubes attractive. The combined use of multiwalled carbon nanotubes (2%) and carbon black (10%) as thermally conductive constituents in a thermal interface material is recommended by Zhang et al., *Proceedings—Electronic Components & Technology Conference* (2005), 55th (Vol. 1), 60-65, published by Institute of Electrical and Electronics Engineers.

Due to its relatively low thermal conductivity, carbon black has not been suggested in the art prior to the priority date of Jul. 9, 2003 of this invention for use as a constituent in the formulation of a thermal interface material. Furthermore, carbon black has not been suggested in the art prior to the priority date of Jul. 9, 2003 of this invention for use in a thermal interface material for enhancing the conformability or spreadability of the interface material. In addition, carbon black has not been suggested in the art prior to the filing date of Jun. 28, 2006 of the present continuation-in-part application for use as the main thermally conductive constituent in a thermal interface material.

Due to the high thermal conductivity along the axis of a carbon nanotube, various forms of thermal interface materials involving carbon nanotubes have been reported. They include a carbon nanotube paste (PCT Int. Appl. WO 2006048848 (2006)), a carbon nanotube paraffin-matrix composite (U.S. Pat. Appl. Publ. US 20060073332 (2006)), aligned carbon nanotubes (U.S. Pat. Appl. Publ. US 20050255304 (2005)), a carbon nanotube array in a polymer matrix (US. Pat. Appl. Publ. US 20040097635 (2004)), carbon nanotubes aligned by using an alignment material such as a clay material (PCT Int. Appl. WO 2005031864 (2005)), a carbon nanotube array affixed to the surface of a thermal interface material layer (U.S. Pat. Appl. Publ. US 20040184241 (2004), carbon nanotubed distributed in a silver paste (Faming Zhuanli Shenqing Gongkai Shuomingshu CN 1667821 (2005), and an array of carbon nanotubes with silver filled therein (U.S. Pat. Appl. Publ. US 20060118791 (2006) and Faming Zhuanli Shenqing Gongkai Shuomingshu CN 1632040 (2005)). The high cost of the carbon nanotubes, the high cost of making carbon nanotube arrays, the geometric limitations of the arrays and the limited choices of array substrates are disadvantages that make practical use of these nanotube technologies difficult.

Due to its high thermal conductivity, boron nitride is used as a thermally conductive constituent in thermal interface materials. Compared to boron nitride, zinc oxide is less thermally conductive, but it is less expensive. Zinc oxide (ZnO) is the thermally conductive constituent of choice in the thermal interface material formulation in U.S. Pat. No. 6,475,962 (2002). Boron nitride (BN) is the thermally conductive constituent of choice in the thermal interface material formulations in U.S. 20040241410 (2004) and U.S. 20040081843 (2004).

Boron nitride suffers from the disadvantage that it degrades when exposed to humidity. When placed in a humid environment, hygroscopic impurities (boric oxide) within the compound absorb atmospheric water, which then reacts with the boron nitride to form boric acid. Being hygroscopic, the boric acid absorbs further water, thereby accelerating the degradation of the boron nitride and diminishing its heat removing capabilities, which ultimately leads to failure of the device. The PCT Application WO 01/21393 is specifically directed to this problem and describes a moisture resistant, thermally conductive material that includes thermally conductive filler particles, preferably boron nitride, that are coated with a hydrophobic compound, preferably a silicone compound such as a siloxane. The hydrophobic compound-coated filler particles are joined together with a binder, and account for between 5 and 70 vol. % of the material.

The vehicle of a thermal paste is typically not a thermal conductor. The thermal conductivity of the vehicle is typically much lower than that of thermally conductive fillers. Thus, the higher is the proportion of thermally conductive constituent in a thermal paste, the higher is the thermal conductivity of the paste.

For the purpose of maximizing the thermal conductivity of a thermal paste, it is customary in the prior art to use thermally conductive constituents at high proportions. For example, zinc oxide in the amount of 72.8% is used in the formulation in U.S. Pat. No. 6,475,962 (2002), boron nitride in the amount of 30% is used in the formulation in U.S. 20040081843 (2004), boron nitride in the amount of at least 25% is used in the formulation in U.S. 2004241410 (2004), and carbon black in the amount of 10% (along with multiwalled carbon nanotubes) is used in the formulation reported by Zhang et al., *Proceedings—Electronic Components & Technology Conference* (2005), 55th (Vol. 1), 60-65, published by Institute of Electrical and Electronics Engineers.

Both thermal conductivity and conformability help the performance of a thermal paste. The workability and conformability of a thermal paste diminish with increasing conductive filler content, although the thermal conductivity of the paste increases with increasing filler content. Thus, the use of an excessively high filler content results in low conformability, though the thermal conductivity is enhanced. Prior work on the development of thermal pastes has emphasized the attainment of a high thermal conductivity in the paste by using very high contents of conductive fillers. The low conformability that results from the high filler content has been of relatively little concern in prior work. Thus, prior work has emphasized the development of a workable paste that has a high content of the conductive filler. The approach in prior work largely involves the use of surfactants and the treatment of the surfaces of the filler particles (e.g., BN, ZnO, $Al_2O_3$, etc.) for the purpose of improving the workability, and the use of particles of different sizes in the same paste for the purpose of increasing the filler content.

Thermal conductivity has long been assumed in the thermal interface material industry to be the key criterion in determining the effectiveness of a thermal interface material, but it is actually less important than conformability or spreadability, as unexpectedly found in the present invention. As long as the thermal interface material is more thermally conductive than air, its presence can improve the thermal contact. On the other hand, if the thermal interface material is relatively large in thickness, its thermal conductivity can be important. Thus, this invention emphasizes thermal pastes that are small in thickness (less than 50 μm, typically less than 25 μm) during use after application, in contrast to prior work, which emphasizes thermal pastes that are much larger in thickness (above 50 μm, typically above 100 μm).

The conformability of a thermal paste also depends on the vehicle, i.e., the matrix. Silicone is the most commonly used vehicle, in spite of its high viscosity and the consequent low conformability and low spreadability. For example, U.S. Pat. Appl. Publ. US 20030171487 (2003) uses silicone and recognizes the high viscosity of the resulting thermal interface material. U.S. Pat. Appl. Publ. US 20050150887 (2005) and Faming Zhuanli Shenqing Gongkai Shuomingshu CN 1715360 (2006) also use silicone as the matrix.

During use, it is preferred that a thermal paste does not seep out of the interface, as the seepage can cause contamination and, in the case of an electrically conductive paste, short circuiting of the electronics around the thermal contact. Therefore, a thixotropic paste (a paste that flows only under an applied stress) is preferred to a fluidic paste (a paste that flows even in the absence of an applied stress). Silicone is thixotropic. Polyol ester can also be used to form a thixotropic paste, as described in U.S. Pat. No. 6,475,962 (2002) and U.S. Pat. Appl. Publ. US 20040018945 (2004).

Metal alloys with low melting temperatures (such as solders) applied in the molten state have long been used as thermal interface materials. However, they tend to suffer from the chemical reactivity of the liquid alloy with some metal surfaces (such as copper). The reaction products can interfere with the contact between the liquid alloy and a metal surface. Thus, although metals are high in thermal conductivity, they have limited conformability, thereby resulting in limited effectiveness as thermal interface materials. Furthermore, alloys suffer from the need to heat during their application. In contrast, thermal pastes do not require heating. Xu, Luo and Chung, *J. Electron. Pkg.* 124:188-191 (2002); Xu, Luo and Chung, *J. Electron. Pkg.* 122:128-131 (2000); both are hereby incorporated by reference in their entirety.

Organic vehicles are commonly used as the suspending medium for dispersed inorganic particles in pastes. Kumar, *Active & Passive Elec. Comp.* 25:169-179(2002); Chae et al., *Mater. Lett.* 55:211-216 (2002); Heller et al., *Tenside, Surfactants, Detergents* 29:315-319 (1992); Stanton, *Int. J. Hybrid. Microelec.* 6:419-432 (1983). An organic vehicle system may consist of a solvent (such as butyl ether) (Bernazzani et al., *J. Chem. Therm.* 33:629-641 (2001)) and a solute (such as ethyl cellulose) (Faming Zhuanli Shenqing Gongkai Shuomingshu CN 1715360 (2006); Stanton, *Int. J. Hybrid Microelec.* 6:419-432 (1983)), which serves to enhance the dispersion and suspension. Kumar, *Active & Passive Elec. Comp.* 25:169-179(2002). Ethyl cellulose has the further advantage of its slight conductivity. Khare et al., *Polym. Int.* 42:138-142 (1997); Khare et al., *Polym. Int.* 49:719-727 (2000).

Another organic vehicle is polyethylene glycol (PEG) of molecular weight 400 amu, which is different from silicone in its low viscosity. By using PEG in conjunction with boron nitride particles as a thermal paste between copper disks (of surface roughness 0.05 μm), a thermal contact conductance of $1.9 \times 10^5$ W/m$^2$·°C. has been attained. This value is higher than that obtained by using a thermal paste involving silicone and boron nitride powder ($1.1 \times 10^5$ W/m$^2$·°C.), but is lower than that obtained by using solder, applied in the molten state ($2.1 \times 10^5$/m$^2$·°C.). Xu, Luo and Chung, *J. Electron. Pkg.* 124:188-191 (2002). In fact, all thermal pastes previously reported are inferior to solder in providing high thermal contact conductance. The use of PEG as the matrix is also mentioned in Faming Zhuanli Shenqing Gongkai Shuomingshu CN 1715360 (2006).

Carbon black is in a very fine particulate form and consists of typically spherical particles, which in turn come together to form porous agglomerates. Carbon black is produced either by incomplete combustion or thermal decomposition of a hydrocarbon feedstock. Types of carbon black include soot, lamp black (typical particle size 50-100 nm), channel black (typical particle size 10-30 nm), furnace black (typical particle size 10-80 nm), thermal black (typical particle size 150-500 nm), and acetylene black (typical particle size 35-70 nm).

Carbon black is used as a low-cost electrically conductive filler in polymers. Nakamura et al., *NEC Res. & Dev.* 83:121-127 (1986); Saad et al., *J. Appl. Polym. Sci.* 73:2657:2670 (1999). Most commonly, it is used as a reinforcement in rubber. Takirio et al., *Tire Sci. & Tech.* 26:241-257 (1998); Haws et al., *Rub. Div. Symp., ACS, Akron, OH* 1:257-281 (1982); Hess et al., *Rub. Chem. & Tech.* 56:390-417 (1983); Kundu et al., *J. Appl. Polym. Sci.* 84:256-260 (2002); Ramesan et al., *Plas. Rub. & Comp.* 30:355-362 (2001); Sridhar et al., *J. Appl. Polym. Sci.* 82:997-1005 (2001).

In addition, carbon black is used in electrochemical electrodes (Takei et al., *J. Power Sources* 55:191-195 (1995); Van Deraerschot et al., *Electrochem. Soc. Ext. Abst., Electrochem. Soc., Pennington, N.J.* 84:139 (1984)), inks (Erhan et al., *J. Am. Oil Chem. Soc.* 68:635-638 (1991); Bratkowska et al., *Przemysl Chemiczny* 66:393-395 (1987); Bratkowska et al., *Przemysl Chemiczny* 65:363-365(1986)), lubricants (Chinas-Castillo et al., *Tribology Trans.* 43:387-394 (2000); Shiao et al., *J. Appl. Polym. Sci.* 80:1514-1519 (2001); Kozlovtsev et al., *Glass & Ceramics (English Translation of Steklo I Keramika)* 154-157; Bakaleinikov et al., *Chem. & Tech. Fuels & Oils* 18:108-111 (1982)), fuels (Srivastava et al., *Fuel* 73:1911-1917 (1984); Steinberg, *Preprints: Div. Pet. Chem., ACS* 32:565-571 (1987); Smith, *Automotive Eng.* (London) 7:23-24, 27 (1982)), and pigments (Ueki et al., *Ann. Conf. Elec. Ins. & Dielec. Phen., Ann. Rpt., IEEE, Piscataway, N.J.* 1:170-176 (1997)).

A thermal interface material in the form of a sheet coated with a paste on both sides is attractive in that it can be conveniently handled like a sheet and that its thickness can be adjusted by adjusting the thickness of the sheet at its core. The sheet serves as a carrier for the paste. The ability to adjust the thickness is advantageous for applications in which the surfaces of the heat source and heat sink are locally apart from one another due to insufficient alignment, parallelism or flatness of the surfaces. Such thermal interface materials are known as thermal gap filling materials. A thermal interface material in the form of a copper mesh coated with a slurry that comprises a liquid metal alloy has been disclosed (PCT Int. Appl. WO 2005053021 (2005)).

Examples of sheets are fiber mats, wire meshes, fabrics, metal foils (such as aluminum foils and copper foils) and flexible graphite. A thermal interface material cannot be thermally insulating. Fiber mats, wire meshes and fabrics are porous. The thermally conductive paste can penetrate a porous sheet. Thus, a sheet does not have to be thermally conductive, if it is porous. Metal foils and flexible graphite are not porous, unless holes are made through them. However, they are thermally conductive.

"Flexible graphite" does not simply mean graphite that is flexible. It is a term that refers to a special form of graphite that is made by compression of exfoliated graphite flakes in the absence of a binder (Luo, Chugh, Biller, Hoi and Chung, *J. Electron. Mater.* 31:535-544 (2002); Luo and Chung, *Carbon* 39:985-990 (2001); Chung, *J. Mater. Sci.* 22:4190-4198 (1987), which are hereby incorporated by reference in their entirety).

The exfoliated graphite flakes used to make flexible graphite have an accordion microstructure. Due to the large expansion in the thickness of a flake upon exfoliation, an exfoliated flake is not of the shape of a flake, but is of the shape of a column, which is called a "worm" (due to the column shape and that the column can bend). The accordion microstructure allows the worms to mechanically interlock upon compression in the absence of a binder. Flexible graphite is a sheet that is flexible and is resilient in the direction perpendicular to the sheet. This resiliency results in some degree of conformability in the direction perpendicular to the sheet. This conformability is useful in relation to the use of flexible graphite as a thermal contact enhancing interface material, as is shown in the present invention.

Flexible graphite as a thermal interface material has been disclosed by Marotta et al., *IEEE Trans. Compon. Pack. Tech.* 28:102-110 (2005). Flexible graphite sheets containing oil have been disclosed in U.S. Pat. Appl. Publ. US 20050175838 (2005) and U.S. Pat. Appl. Publ. US 20030118826 (2003) for use as thermal interface materials.

Pressure applied to squeeze together the proximate surfaces with a thermal paste in between may or may not help the heat transfer across the interface, as shown by Xu, Luo and Chung, *Journal of Electronic Packaging* 122:128-131 (2000). The patent U.S. Pat. No. 6,472,742 (2002) teaches against the use of pressure.

The present invention is directed to overcoming these and other deficiencies in the art.

SUMMARY OF THE INVENTION

In contrast to prior art, this invention takes the approach of using a filler (solid component) that is itself conformable, though not high in thermal conductivity, in the formulation of a thermal paste. This filler is carbon black, which is unusual in that it is in the form of porous agglomerates of nanoparticles. Due to the porous agglomerate microstructure, carbon black is highly compressible (squishable) and is hence conformable in the solid state. Due to the small size (e.g., 30 nm, i.e., 30 nanometers) of the nanoparticles in carbon black, conformability is possible in a fine scale. Thus, a thermal paste with carbon black as the conductive filler exhibits exceptional effectiveness as a thermal interface material, as disclosed in this invention.

One aspect of the present invention relates to a conformable, spreadable and thermally conductive paste comprising porous agglomerates of carbon black dispersed in a paste-forming vehicle, wherein the paste, upon compression between two solid surfaces, forms an interface material that enhances the thermal contact.

Another aspect of the present invention relates to a thermal contact enhancing interface material which, upon compression between two solid surfaces, forms a material that enhances the thermal contact between said surfaces. Said material comprises (i) a sheet, and (ii) the abovementioned conformable paste on each of the two opposite sides of the sheet.

A further aspect of the present invention is a method of improving the thermal contact between two solid surfaces. Said method involves disposing a layer of a thermal contact enhancing interface material made in accordance with the present invention between and in contact with the two surfaces.

The thermal contact enhancing paste of the present invention is highly conformable, spreadable and thermal conductive. By using porous agglomerates of carbon particles as the thermally conductive ingredient, thermal pastes that are superior to solder and to silver paste in providing high thermal contact conductance have been attained. Thermally conductive interface materials prepared in accordance with the present invention can provide thermal contact conductance between copper mating surfaces (of roughness 0.05 μm, i.e., 0.05 micrometer) of $3.0 \times 10^5$ watts/meter$^2$.° C. (W/m$^2$.° C.), as compared to $2.0 \times 10^5$ W/m$^2$.° C. for solder and $1.8 \times 10^5$ W/m$^2$.° C. for silver paste. Although silver is much more thermally conductive than carbon black, the silver particles in silver paste are not conformable. Moreover, the high loading of silver particles (about 30 vol. %) in the silver paste makes the paste high in viscosity and hence low in conformability. In contrast, carbon black is conformable even in the solid state. Furthermore, the loading of carbon black in the carbon black paste is low (less than about 4 vol. %), so that the paste is low in viscosity. Due to the relatively low conformability, silver paste is less effective than carbon black paste as a thermal interface material. Thus, conformability is a key to the performance of a thermal interface material. Conformability can be even more important than the thermal conductivity within the thermal interface material in governing the effectiveness of a thermal interface material, as shown by comparison of the performance of carbon black paste and silver paste.

Solder is also more thermally conductive than carbon black, but the reactivity of molten solder with the copper surfaces causes the formation of reaction products at the interface, thereby making the molten solder not able to conform to the surface topography of the copper. Solder requires heating during its application, but thermal interface materials of this invention do not require heating.

Thermal contact enhancing interface materials of the present invention have many applications. Interface materials prepared in accordance with the present invention may be used, for example, for microelectronic cooling, for heat pipes for tapping geothermal energy (Lockett, *H. & V. Eng.* 59:7-8; Lockett, *Proc. Eur. Cong.*, 1:285-289 (1984)) and for thermal fluid heaters for providing indirect process heat (Dawes et al., *Inst. Energy, London, UK Pap. KN/III/2* 1:8pp (1984)). Interface materials prepared in accordance with the present invention may also be used, for example, for the cooling of machinery, boilers, cutting tools, oil drilling equipment components, spacecraft components and building components. Other applications may be in connection with foods, wound healing, therapeutics, etc.

Thermal contact enhancing interface materials of the present invention can be used to improve the thermal contact between a heat source and a heat sink. They can also be used to improve the thermal contact between a cold source and an object proximate the cold source, for the purpose of cooling the object or other objects connected to the object. The pastes, may for example, be applied to improve the thermal contact between a fluid-cooled object (the cold source) and a cold plate or a cold finger, for the purpose of cooling an object connected to the cold plate or cold finger.

DETAILED DESCRIPTION OF THE INVENTION

Figure 1:
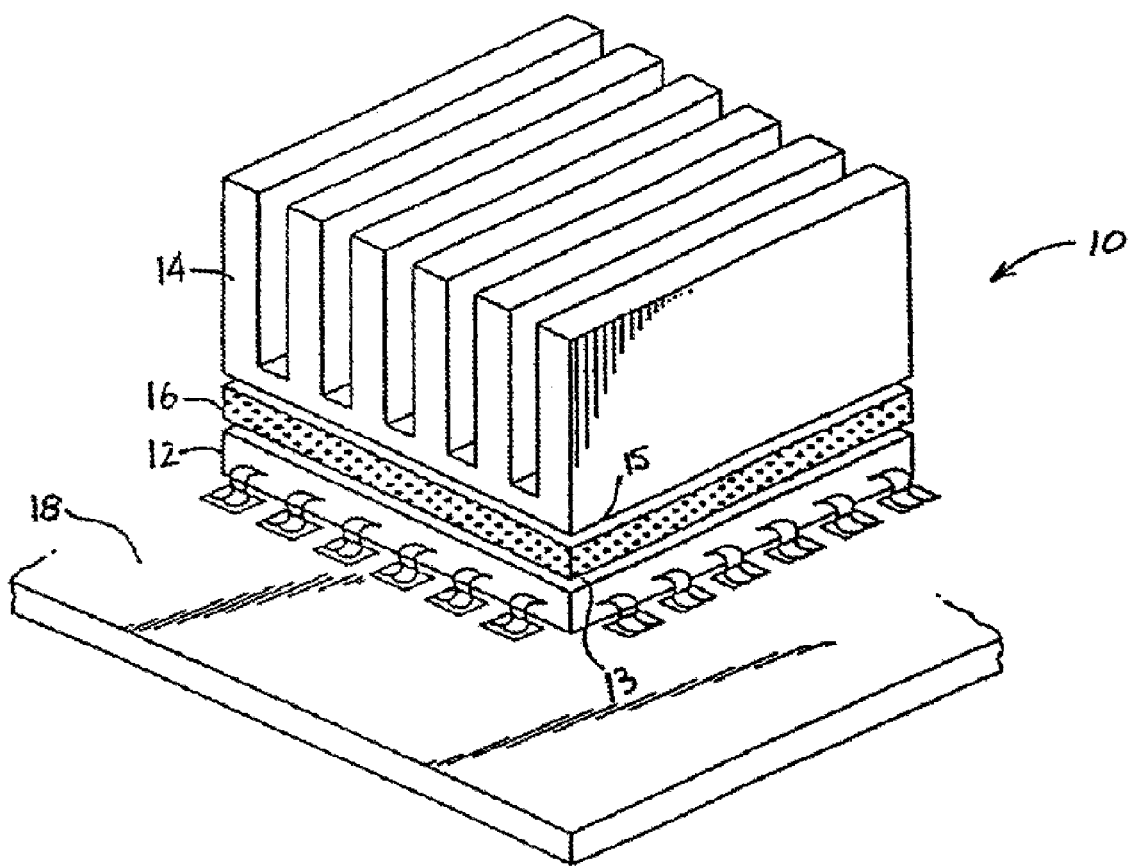
FIG. 1 is a partial, perspective view of a layer of a thermally conductive paste made in accordance with the present invention disposed between an integrated circuit chip and a heat sink.

The present invention relates to a thermal contact enhancing interface material comprising: a conformable, spreadable and thermally conductive paste comprising porous agglomerates of carbon black dispersed in a paste-forming vehicle, wherein the paste, upon compression between two solid surfaces, forms a material that enhances the thermal contact between the two surfaces. The amount of carbon black dispersed in the paste is preferably less than about 4 vol. %. Each of the agglomerates comprises carbon particles of particle size preferably less than about 100 nm (nanometer). The two solid surfaces are compressed at a pressure preferably less than about 1 MPa. The paste-forming vehicle comprises organic liquids preferably chosen from the group: polyol ester, pentaerythritol ester of linear and branched fatty acids, dipentaerythritol ester of linear and branched fatty acids, polyethylene glycol, polyethylene glycol with dissolved ethyl cellulose, di(ethylene glycol) butyl ether, di(ethylene glycol) butyl ether with dissolved ethyl cellulose. The paste-forming vehicle preferably comprises polyethylene glycol of molecular weight less than about 1,000 amu (atomic mass unit).

The two surfaces mentioned above can be, for example, the proximate surfaces of a heat source and a heat sink, or those of a cold source and an object. A particularly important application that is directed at the dissipation of heat from an electronic apparatus involves the two surfaces being the proximate surfaces of an integrated circuit chip and a heat sink. For any application, during use, the two surfaces are at different temperatures and heat flows from the surface at a higher temperature to the other surface across the interface between the two surfaces.

Conformability of a thermal interface material that contains a sheet can be provided by the conformable paste on both sides of the sheet, although it can also be contributed by the sheet, which is less conformable than the paste. Thus, an interface material for enhancing the thermal contact between two surfaces can comprise a sheet and a conformable, spreadable and thermally conductive paste on both sides of said sheet. During use, the paste is between said sheet and each of two said surfaces. When compressed between said surfaces, the interface material forms a material that enhances the thermal contact between said surfaces. Compression of the interface material is accompanied by compression of the paste.

The present invention also relates to a thermal contact enhancing interface material which, upon compression between two solid surfaces, forms a material that enhances the thermal contact between the two surfaces. Said interface material comprises (i) a sheet, and (ii) a conformable, spreadable and thermally conductive paste on each of the two opposite sides of the sheet. Said paste comprises porous agglomerates of carbon black dispersed in a paste-forming vehicle. Each of the agglomerates comprises carbon particles of particle size preferably less than about 100 nm. The amount of carbon black dispersed in the paste is preferably less than about 4 vol. %. Said paste, when compressed between said solid surfaces, is of thickness preferably less than about 100 µm. The two solid surfaces are compressed at a pressure preferably less than about 1 MPa. Said sheet preferably comprises a thermally conductive material selected from the group: aluminum, copper, steel, brass, bronze, silver, gold, titanium, tungsten, molybdenum, graphite, flexible graphite, carbon fiber, diamond, metal coated polymer, metal coated glass. The paste-forming vehicle preferably is an organic liquid chosen from the group: polyol ester, pentaerythritol ester of linear and branched fatty acids, dipentaerythritol ester of linear and branched fatty acids, a mixture of polyol esters, polyethylene glycol, polyethylene glycol with dissolved ethyl cellulose, di(ethylene glycol) butyl ether, di(ethylene glycol) butyl ether with dissolved ethyl cellulose. The paste-forming vehicle preferably comprises polyethylene glycol of molecular weight less than about 1,000 amu.

Types of carbon black include soot, lamp black (typical particle size 50-100 nm), channel black (typical particle size 10-30 nm), furnace black (typical particle size 10-80 nm), thermal black (typical particle size 150-500 nm), and acetylene black (typical particle size 35-70 nm), for example.

In one aspect, the paste-forming vehicle may be a paste-forming vehicle system. Typically, a paste-forming vehicle system will include a paste-forming solvent and optionally a solute. The system may, for example, be organic-based or inorganic based. Examples of solvents that may be used in a paste-forming vehicle system can include, but are not limited to, polyol esters, silicates (such as, for example, sodium silicate), glycol ethers (such as, for example, di(ethylene glycol) butyl ether ("BE")), methoxypolyethylene glycol ("MPEG"), ethylene glycol, propylene glycol, ethylene oxide, propylene oxide, polyethylene glycol ("PEG"), PEG modified with various types of functional groups (such as, for example, —H, —CH$_3$, etc.) at the ends of the macromolecular chain, oil, water, alcohols (such as, for example, 2-ethylhexanol, 2-ethylhexoic acid, 2-methyl butanol, propanol, ethanol, diacetone alcohol, isobutanol, isopropanol, n-butanol, n-pentanol, n-propanol, etc.), diethyl sulfate, diisobutyl carbinol, diisobutyl ketone, hexylene glycol, isobutyl acetate, isophorone, isopropyl acetate, methyl isobutyl carbinol, ketone (such as, for example, methyl isobutyl ketone), n-butyl acetate, n-propyl acetate, primary amyl acetate mixed isomers, primary amyl alcohol mixed isomers, n-propyl propionate, n-butyl propionate, n-pentyl propionate, methylene chloride, perchloroethylene, trichloroethylene, xylene, acetone, ethyl acetate, and chemically related substances.

Examples of solvents that may be used in a paste-forming vehicle system can include, but are not limited to, cellulosic resin, thermoplastic resin, glycidyl methacrylate, hydroxy (meth)acrylate monomers, epsilon-caprolactone monomer, hydroxypropyl acrylate, hydroxyethyl acrylate, ethylene acrylic acid, divinylbenzene, styrene-butadiene latexes, acrylic latexes, vinyl acrylic latexes, styrene acrylic latexes, vinyl versatate latexes, vinyl chloride, vinylbenzyl chloride, chloromethylstyrene, vinyl acetate copolymers, epoxy resins, epoxy acrylate, aminoethylethanolamine, glycol ethers, propylene glycols, ethylene glycols, polyols (e.g., aliphatic polyester polyols), ethylene acrylic acid resins, methylcellulose, ethyl cellulose, hydroxyethyl cellulose, polyvinyl alcohol, starch, and chemically related substances. The choice of solute will typically depend on the choice of solvent. At least the last four solutes, for example, are soluble in water.

An organic-based paste-forming vehicle system may include, for example, a solvent such as polyol ester, polyethylene glycol or di(ethylene glycol) butyl ether, and optionally a solute, such as ethyl cellulose. The paste-forming vehicle comprises organic liquids preferably chosen from the group: polyol ester, pentaerythritol ester of linear and branched fatty acids, dipentaerythritol ester of linear and branched fatty acids, polyethylene glycol, polyethylene glycol with dissolved ethyl cellulose, di(ethylene glycol) butyl ether, di(ethylene glycol) butyl ether with dissolved ethyl cellulose at least one polyol ester.

In some instances, such as with water-based and alcohol-based pastes, the solvent evaporates, allowing the conductive units (i.e., carbon black agglomerates) to be in intimate contact after the paste has dried. In contrast, oil-based and some polymer-based pastes do not dry. Ether itself is volatile, but the dissolution of a solute such as ethyl cellulose in it results in a paste-forming vehicle that is not volatile, such that the resulting paste does not dry, as in the case of certain polymer-based pastes.

In one aspect, a thermally conductive paste prepared in accordance with the present invention may, for example, incorporate a paste-forming vehicle system including PEG as a solvent and ethyl cellulose as a solute. In this aspect, the amount of ethyl cellulose present in the paste will preferably be within the range from about 2 to about 4 volume percent (vol. %). More preferably, the amount of ethyl cellulose present in the paste will be about 3 vol. %. Furthermore, the amount of carbon black dispersed in the paste will preferably be less than about 2.0 vol. %, and more preferably, less than about 1.5 vol. %.

A particularly useful thermal contact enhancing paste of the present invention includes porous agglomerates of carbon black dispersed in a paste-forming vehicle system including ethyl cellulose in PEG, where the amount of carbon black dispersed in the paste is about 1.25 vol. % and the amount of ethyl cellulose present in the paste is about 3 vol. %.

In another aspect, a thermal contact enhancing paste prepared in accordance with the present invention may, for example, incorporate a paste-forming vehicle system including di(ethylene glycol) butyl ether as a solvent and ethyl cellulose as a solute. In this aspect, the amount of ethyl cellulose present in the paste will preferably be about 40 vol. %. In addition, the amount of carbon particles dispersed in the paste will preferably be less than about 0.40 vol. %, and more preferably, about 0.20 vol. %.

Yet another particularly useful thermal contact enhancing paste of the present invention includes porous agglomerates of carbon black dispersed in a paste-forming vehicle that includes one or more polyol esters, where the amount of carbon black dispersed in the paste ranges from about 2 vol. % to about 3 vol. %, preferably about 2.4 vol. %.

Referring now to FIG. 1, an electronic apparatus 10 made in accordance with the present invention includes a heat source 12, such as, an integrated circuit chip, and a heat sink 14. A layer 16 of a thermal contact enhancing paste made in accordance with the present invention is disposed as an interface material between and in contact with the heat source 12 and the heat sink 14. While the layer 16 of thermal contact enhancing paste can be formed in a variety of shapes and sizes to fill particular needs, it is preferred in this context that it substantially covers the entire surfaces of the heat source/heat sink interface.

As illustrated, the heat source 12 is mounted to a circuit board 18. The heat source 12 is operably connected to an electrical source (not shown) and operates conventionally. As heat is generated by the heat source 12, the heat is conducted from a heat source outer surface 13 across the layer of thermal contact enhancing material of the present invention to a heat sink inner surface 15. The heat is thereafter conventionally dissipated to the atmosphere through the heat sink 14, as known in the art. Additionally, because the layer 16 of thermal contact enhancing paste substantially covers and conforms to both the heat source outer surface 13 and the heat sink inner surface 15, the thermal contact resistance is minimized.

The present invention is further directed at a method of providing a thermal contact between two solid surfaces, said method comprising disposing between and in contact with said surfaces a material comprising: a conformable, spreadable and thermally conductive paste comprising porous agglomerates of carbon black dispersed in a paste-forming vehicle, and applying a pressure to cause said material to conform to the topography of said surfaces. The two surfaces can, for example, be the proximate surfaces of a heat source and a heat sink. Said paste, when compressed between said solid surfaces, is preferably of thickness less than about 100 µm. Said pressure is preferably less than about 1 MPa. Each of the agglomerates comprises carbon particles of particle size preferably less than about 100 nm. The paste-forming vehicle comprises organic liquids preferably chosen from the group: polyol ester, pentaerythritol ester of linear and branched fatty acids, dipentaerythritol ester of linear and branched fatty acids, polyethylene glycol, polyethylene glycol with dissolved ethyl cellulose, di(ethylene glycol) butyl ether, di(ethylene glycol) butyl ether with dissolved ethyl cellulose at least one polyol ester.

The abovementioned method is particularly useful for removing heat from a heat source, as needed for aiding the dissipation of heat from a microelectronic device or apparatus. In this context, the method involves providing a heat sink proximate the heat source and disposing a layer of a thermal contact enhancing material of the present invention between and in contact with the heat source and the heat sink.

The examples that follow are focused on the formulation and performance of thermal contact enhancing interface materials. In particular, they address the addition of various thermally conductive fillers to organic vehicles for the purpose of providing a thermal paste which is conformable, spreadable and effective a thermal interface material. The fillers evaluated include carbons (such as, carbon black, 1 µm and 5 µm graphite particles, 0.1 µm diameter discontinuous carbon filaments and 25 µm diamond particles), nickel particles (1 µm and 3 µm in size) and hexagonal boron nitride particles (5-11 µm size).

Graphite differs from carbon black in its higher degree of crystallinity, greater degree of preferred crystallographic orientation, larger crystallite size, larger particle size, and the absence of a porous agglomerate structure. These attributes make graphite a superior thermal conductor, at least in the in-plane direction of graphite (i.e., in the plane of the carbon layers). On the other hand, the absence of a porous agglomerate structure and the relatively large particle size (typically around 1 µm or more) make graphite much less conformable than carbon black. Boron nitride is a thermally conductive filler that is commercially used in high grades of thermal pastes. The examples include a comparative study of pastes with various fillers.

Of all these fillers, carbon black, which is porous, is the only type that is itself squishable (i.e., highly compressible). Due to the squishability, carbon black is conformable to the topography of the mating surfaces and is spreadable. Galli, *Plastics Compounding* 5:22-32 (1982), which is hereby incorporated by reference in its entirety. The conformability and spreadability are believed to be the reasons behind the superior performance of carbon black compared to all the other fillers investigated. Helsen et al., *Colloid. & Polym. Sci.* 264:619-622 (1986); Mewis et al., *Colloids & Surfaces* 22:271-289 (1987); Genz et al., *J. Colloid & Interface Sci.* 165:212-220 (1994), which are hereby incorporated by reference in their entirety.

Furthermore, the porosity of a carbon black particle allows penetration of the vehicle into a carbon black particle, thereby enabling the resulting paste to have high fluidity, as previously shown for the case of oil as the vehicle. Ishii et al., *Carbon* 39:2384-2386 (2001); Trappe et al., *Phys. Rev. Lett.* 85:449-452 (2000); Kratohvil et al., *Colloids & Surfaces* 5:179-186 (1982); Fitzgerald et al., *Rubber Chem. & Tech.* 55:1569-1577 (1982); Amari, *Progress in Organic Coatings* 31:11-19 (1997), which are hereby incorporated by reference in their entirety.

The examples further provide a comparative study of various organic vehicles and vehicle systems, such as, polyol esters, PEG with 0-15 vol. % dissolved ethyl cellulose, and di(ethylene glycol) butyl ether with 0-40 vol. % dissolved ethyl cellulose. In addition, they provide a comparative study of various thermal interface materials in the form of sheets that have been coated with a thermal paste on each of the two opposite surfaces.

For surfaces encountered in practical applications, such as the surfaces of heat sinks and microprocessors, the roughness is typically much more than the submicron level. The need for the thermal paste to fill deep valleys in the surface topography would make the thermal conductivity within the paste more important than when the valleys are shallow. Therefore, the relative performance of carbon black paste (attractive in its conformability and spreadability) and silver paste (attractive in its thermal conductivity) may be different for rough mating surfaces versus smooth mating surfaces. The examples describe this difference.

The examples also compare the performance of the carbon black paste of this invention with that of commercial thermal pastes that are recognized by the industry to be the best, namely the products of Arctic Silver Inc. (Visalia, Calif.). Specifically, these products are (i) Ceramique (density 2.7-2.8 g/ml; oils with aluminum oxide, boron nitride and zinc oxide submicron particles, but without metal particles), (ii) Arctic Silver 5 (density 4.05-4.15 g/ml; oils with over 88 wt. % silver particles, together with a small percentage of submicron zinc oxide, aluminum oxide and boron nitride particles), and (iii) Arctic Silver 3 (density 3.3-3.5 g/ml; oils with over 75 wt. % silver particles, together with a small percentage of micron sized boron nitride particles to improve the flow characteristics).

The examples also include comparison of the performance of the carbon black paste of this invention, that of combinations of carbon black paste and silver paste and that of combinations of carbon black paste and ceramic paste. An example of a combination is a mixture of carbon black paste and silver paste.

For rough mating surfaces, the combined use of carbon black paste and silver paste may be superior to carbon black paste alone or silver paste alone, since carbon black provides the conformability while silver provides the thermal conductivity. The examples describe the synergistic use of carbon black and silver for thermal pastes.

The synergistic use of carbon black and silver is expected to be not as attractive for the case of smooth mating surfaces, since a high thermal conductivity is not required for a thermal paste that is small in thickness and functions mainly by filling shallow valleys only. Nevertheless, the examples include performance data for both smooth and rough mating surfaces for the sake of comparison. The smooth surfaces were obtained by mechanical polishing using 0.05 µm alumina particles; the rough surfaces were obtained by mechanical polishing using 600 grit SiC sand paper (with 15 µm SiC particles).

The synergistic use of carbon black and silver can be attained by mixing carbon black paste and silver paste to form a uniform silver-carbon paste. It can also be attained by using the silver paste to fill the deep valleys of the relatively rough mating surfaces (i.e., planarization), followed by applying a thin overlay of carbon black dispersion. The examples describe both methods of synergistic use for the sake of comparison.

The synergistic use of carbon black and silver is probably akin to that of boron nitride (in a low proportion) and silver (75 wt. %) in the commercial silver paste used in the examples. This commercial silver paste is Arctic Silver 3 (Arctic Silver Inc., Visalia, Calif.). The ease of shear of the micron size boron nitride particles may enhance the conformability of the paste. However, boron nitride particles are not compressible like carbon black (hence not as conformable as carbon black) and they are much larger than the 30 nm carbon black particles. Smaller particles are preferred, due to the need to fill microscopic valleys in the surface topography. In addition, boron nitride is more expensive than carbon black.

The comparative evaluation pertains to the effectiveness of the thermal interface material, the temperature resistance (i.e., the thermal stability), the conformability and the viscosity, as these attributes are relevant to the thermal interface material application. In particular, evaluation of the effectiveness of the thermal interface material is conducted by measuring the thermal contact conductance across two copper mating surfaces with a controlled surface roughness and by measuring the temperature rise of a computer microprocessor under operation. The latter measurement involving a computer pertains to application-oriented testing. From a scientific point of view, the results of testing using a computer are less meaningful than those obtained using a heat flux tester. However, from an application point of view, testing using a computer is meaningful.

EXAMPLES

Example 1

Preparation of Paste Formulations

This example pertains to the preparation of paste formulations. The pastes include fluidic and thixotropic ones. They include pastes with carbon black as the thermally conductive solid component, as well as sheets with a thermal paste coating on each of the two opposite surfaces of the sheet. They also include combinations of carbon black paste and silver paste and of carbon black paste and ceramic paste.

The polyethylene glycol, $HO(CH_2CH_2O)_{11}H$, ("PEG") used as an organic vehicle in a fluidic paste was PEG 400 (EM Science, Gibbstown, N.J.). It had a molecular weight (i.e., average molecular weight) of 400 amu. The molecular weight should not exceed 1,000 amu, as the viscosity of polyethylene glycol increases with increasing molecular weight and a high viscosity tends to be associated with low conformability. The polyethylene glycol used was a liquid at room temperature and optionally contained ethyl cellulose (Sigma Chemical Co., St. Louis, Mo.) at either 3 or 5 vol. %. The ethyl cellulose was a white powder that was dissolved in the vehicle. It served to improve the dispersion and suspension of the solids in the pastes.

Another organic vehicle used in a fluidic paste was di(ethylene glycol) butyl ether (Aldrich Chemical Co., Inc., Milwaukee, Wis.). It optionally contained ethyl cellulose (Sigma Chemical Co., St. Louis, Mo.) at 10, 20, 30 or 40 vol. %.

A vehicle used in a thixotropic paste consisted of polyol esters, which are attractive for their ability to resist elevated temperatures. The polyol esters in the vehicle were pentaerythritol ester of linear and branched fatty acids and dipentaerythritol ester of linear and branched fatty acids. The polyol ester mixture was provided by Hatco Corp., Fords, N.J. The specific gravity was 0.97.

The carbon black used was a type for electrical conductivity and easy dispersion (Vulcan XC72R GP-3820; Cabot Corp., Billerica, Mass.). It consisted of porous agglomerates of carbon particles of particle size 30 nm, density 1.7-1.9 $g/cm^3$, nitrogen specific surface area 254 $m^2/g$ and maximum ash content 0.2%.

Other thermally conductive solids, all used at 0.27 vol. % for the sake of comparison, were (i) artificial graphite particles, Grade Ultra Fine 440, 99.4% typical carbon content, 1 μm typical size (Asbury Graphite Mills, Inc., Asbury, N.J.), (ii) natural crystalline graphite flakes, Grade Micro 850, 98.5% minimum carbon content, 5 μm typical size (Asbury Graphite Mills, Inc., Asbury, N.J.), (iii) carbon filaments, also known a carbon nanofibers (Applied Sciences Inc., Cedarville, Ohio, 0.1 μm diameter, >100 μm length, with intertwined morphology and fishbone texture), (iv) 1 μm nickel particles (INCO, Inc., Mississauga, Ontario, Calif., Type 210), (v) 3 μm nickel particles (Novamet Specialty Products Corp., Wyckoff, N.J., Type 525, 15 to 20 μm length), and (vi) 25 μm diamond particles (Warren Superabrasives, Olyphant, Pa., Type MB).

Also included in the study were boron nitride particles, which were hexagonal BN, equiaxed in shape (as shown by scanning electron microscopy), 5-11 μm size, 280 W/m.K thermal conductivity, as provided by Advanced Ceramics Corporation, Cleveland, Ohio (Polartherm 180).

For pastes with polyol ester as the vehicle, no solute was used. For pastes with PEG or butyl ether as the vehicle, ethyl cellulose was optionally used as a solute to improve the ability of the vehicle to suspend the filler. The pastes involving ethyl cellulose were prepared by first dissolving ethyl cellulose to the vehicle (either PEG or butyl ether). The dissolution was performed at room temperature for butyl ether, but at about 60° C. (with heat provided by a hot plate) for PEG. The heating for the case of PEG was to hasten the dissolution. After mixing, the paste was placed in a vacuum chamber (which involved a mechanical vacuum pump) for the purpose of air bubble removal.

In this work, a silver-carbon paste was obtained by manual mixing of a carbon black paste and Arctic Silver 3 (a commercial silver paste described in the section titled "Detailed Description of the Invention") in the volume ratio of 1:2. Mixing of the carbon black paste and Arctic Silver 5 (another commercial silver paste described in the section titled "Detailed Description of the Invention") produced a paste that was not uniform and not workable, regardless of the proportion used. Therefore, silver-carbon pastes made from Arctic Silver 5 were not evaluated.

The silver pastes are very viscous compared to the highly fluid nature of the carbon black pastes. The ceramic paste (Ceramique, a commercial ceramic paste described in the section titled "Detailed Description of the Invention") is even more viscous than the silver pastes. Therefore, the application of a silver or ceramic paste on a copper disk (two of which are used as proximate surfaces in thermal contact conductance testing, as described in Examples 2 and 3) required manual rubbing of the paste on the surface of the copper. Such rubbing was not needed for the carbon black paste or the carbon-silver mixture mentioned above.

In the alternate method of synergistic use of carbon black and silver, silver paste (either Arctic Silver 3 or Arctic Silver 5) was first applied on a rough copper disk by rubbing, followed by manual removal of the excessive amount above the copper surface. Then, the carbon black paste was applied on the copper surface. Thus, this synergistic use of carbon black and silver involved two layers (referred to as a bilayer) instead of a mixture layer. For the sake of comparison, this work also addresses such synergistic use of carbon black paste and ceramic paste (Ceramique).

Thermal interface materials in the form of sheets were prepared by manual application of a thermal paste on each of the two opposite surfaces of a sheet, such that the thickness of the paste on either surface was 25 μm or less. The sheets used were flexible graphite, copper foil (thickness=either 13 or 130 μm) and aluminum foil (thickness=either 7 or 130 μm). The flexible graphite was of thickness 130 μm, specific surface area 15 $m^2/g$ (as determined by nitrogen adsorption), ash content <5.0%, density 1.1 $g/cm^3$, tensile strength in the plane of the sheet 5.2 MPa, compressive strength (10% reduction) perpendicular to the sheet 3.9 MPa, thermal conductivity 43 W/m.K at 1093° C. in the plane of the sheet and 3 W/m.K perpendicular to the sheet, and coefficient of thermal expansion (CTE) (21-1093° C.) −0.4×10$^{-6}$/° C. in the plane of the sheet.

Example 2

Thermal Contact Conductance Measurement by Transient Method

Figure 2:
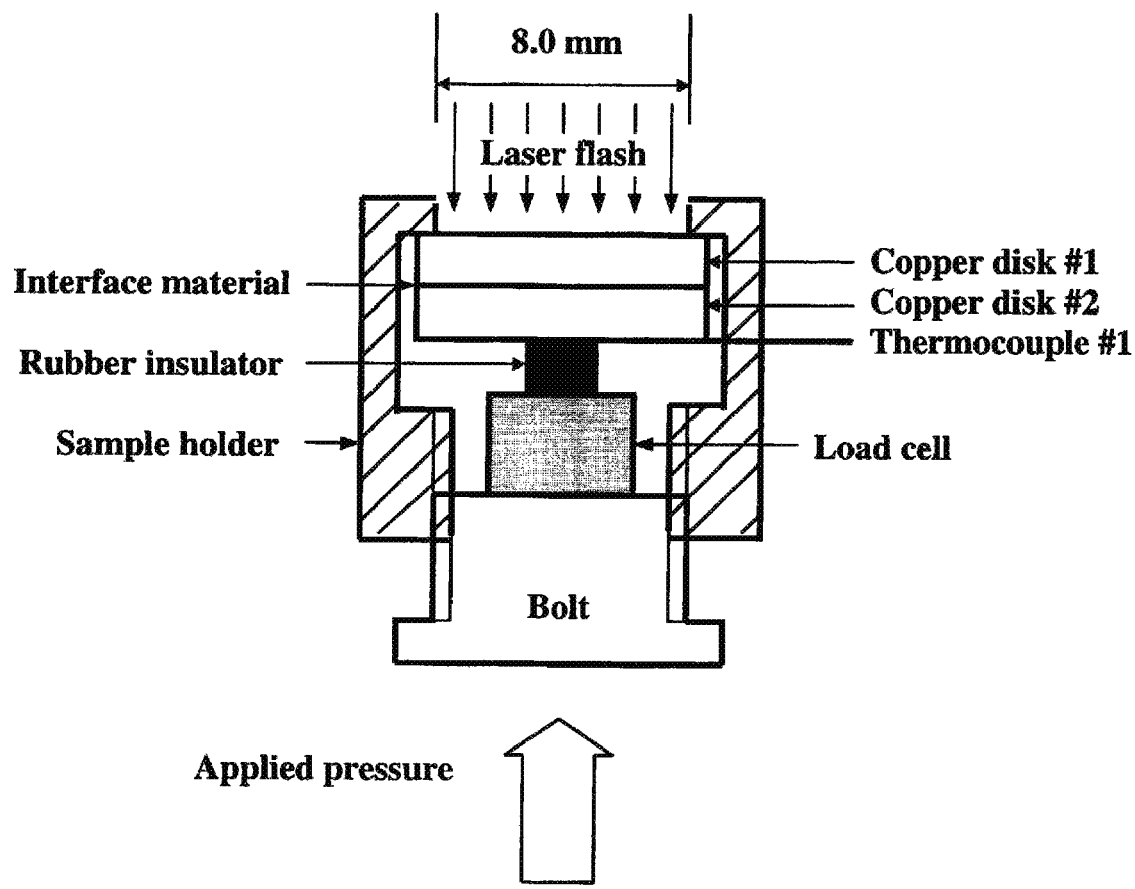
FIG. 2 is a schematic representation of the transient method (laser flash method) of thermal contact conductance measurement in accordance with the present invention.

As depicted in FIG. 2, a layer of a thermal paste (or thermal interface material or solder) 16 was sandwiched between the flat surfaces of two copper disks 20,22 (both surfaces of each disk having been mechanically polished by using either 0.05 or 15 μm alumina particles), which had diameter 12.6 mm and thickness of 1.16 mm for one disk and 1.10 mm for the other disk. The thermal contact conductance between two copper disks with and without layer 16 was measured using the transient laser flash method. Xu, Luo and Chung, *J. Electron. Pkg.* 124:188-191 (2002); Xu, Luo and Chung, *J. Electron. Pkg.* 122:128-131 (2000); Parker et al., *J. Appl. Phys.* 32:1679-1683 (1961); Inoue et al., *Yosetsu Gakkai Ronbunshu/Quarterly J. Jap. Welding Soc.*, 6:130-134 (1988), which are hereby incorporated by reference in their entirety.

The pressure on the sandwich (i.e., copper surfaces sandwiching a thermal interface material) was controlled at 0.46, 0.69 and 0.92 MPa. It was applied in the direction perpendicular to the plane of the thermal interface. The pressure affects the thermal contact conductance, even for a material that is not resilient. Xu, Luo and Chung, *J. Electron. Pkg.* 122:128-131 (2000), which is hereby incorporated by reference in its entirety. The thickness of the thermal interface material was 25 μm or less. The uniform distribution of the paste in the plane of the sandwich was made possible by the ability of the paste to flow and the use of the pressure mentioned above. The thermally conductive paste thickness was obtained by subtracting the thicknesses of the two copper disks from the thickness of the sandwich, such that all thicknesses were measured using a micrometer. The thermal interface material thickness for all cases was the same before and after the conductance measurement.

For the sake of comparison, solder (applied in the molten state) was also used as a thermal interface material. The solder was tin-lead-antimony (63 Sn-36.65 Pb-0.35 Sb), with activated Rosin flux core (Solder Type 361A-20R by Measurements Group, Inc., Raleigh, N.C.). Molten solder at a temperature of 187° C., as measured by using a Type-T thermocouple, was sandwiched between copper disks that had been preheated to this temperature also. This temperature was above the liquidus temperature of 183° C. The heat was provided by a hot plate. The copper-solder-copper sandwich was allowed to cool on the hot plate with the power off under slight pressure. The thickness of the solder was 25 μm or less.

The finite element program ABAQUS® (Abaqus, Inc., Pawtucket, R.I.) was used to calculate the thermal contact conductance through temperature vs. time curves, which were experimentally obtained. Xu, Luo and Chung, *J. Electron. Pkg.* 122:128-131 (2000), which is hereby incorporated by reference in its entirety. The calculation assumed no thickness and no heat capacity for the interface between the two copper disks. In addition, it assumed no heat transfer between specimen and environment, except for the absorption of laser energy by the specimen. Moreover, it assumed that the laser energy was uniformly absorbed on the surface of the specimen, that the heat flow was one-dimensional, and that the thermal contact conductance between the two copper disks was uniform. The validity of these assumptions is supported by the calibration result and error analysis given below.

Referring again to FIG. 2, a Coherent General Everpulse Model 11 Nd glass laser (Coherent, Inc., Santa Clara Calif.) with a pulse duration of 0.4 ms, a wavelength of 1.06 μm and a pulse energy up to 15 J was used for impulse heating. The laser flash was incident on the top surface of the sandwich, i.e., the top surface of Copper disk #1 (FIG. 2). The laser power was adjusted to allow the temperature rise, as measured at the bottom surface of the sandwich (i.e., the bottom surface of Copper disk #2, shown in FIG. 2) by using an E-type thermocouple (Thermocouple #1 shown in FIG. 2), to be between 0.5 and 10° C. The upper surface of Copper disk #1 on which the laser beam would directly hit had been coated by carbon in order to increase the extent of laser energy absorption relative to the extent of reflection. A second thermocouple of the same type (Thermocouple #2 shown in FIG. 2) was put about 30 cm above the specimen holder to detect the initial time that the laser beam came out.

A National Instruments DAQPad-MIO16XE-50 data acquisition board (National Instruments, Austin, Tex.) with a data acquisition rate up to 20,000 data points per second at 16 bites resolution, along with NI-DAQ interface software coded in Visual Basic® (Microsoft® Corp., Redmond, Wash.) was used to monitor the response of both thermocouples simultaneously. A plexiglass sample holder, bolt and rubber insulator (FIG. 2), were used to facilitate pressure application. A Sensotec Model 13 (Columbus, Ohio) load cell (FIG. 2) was used for pressure measurement. Calibration using a standard graphite specimen was performed before testing each specimen in order to ensure measurement accuracy. The data acquisition rate used for each test was adjusted so that there were at least 100 temperature data points during the temperature rise.

The experimental error in transient thermal contact conductance measurement consists of random error due to experimental data scatter, and systematic error mainly due to the lag of the thermocouple response and partly due to the method used to calculate the conductance from the temperature data. The higher the thermal contact conductance, the greater is the error. The thermal diffusivity of a standard NBS 8426 graphite disk (thickness=2.62 mm), which had a similar transient temperature rise time as the copper sandwich with the highest thermal contact conductance, was measured prior to testing each specimen in order to determine the systematic error, if any. The random error shown by the ±value was determined by measurement of five specimens.

Example 3

Thermal Contact Conductance Measurement by Steady-State Method

This example pertains to testing the effectiveness of various thermal interface materials by measuring the thermal contact conductance across copper surfaces using a steady-state method. The use of both the transient method of Example 2 and the steady-state method of this example provides further support for the validity of the conductance results reported here.

In the steady-state method, various thermal interface materials were sandwiched between the 1×1 inch (25×25 mm) proximate surfaces of two copper blocks (both 1×1 inch surfaces of each block having a controlled degree of roughness). Each copper block had a height of 35 mm.

Figure 3:
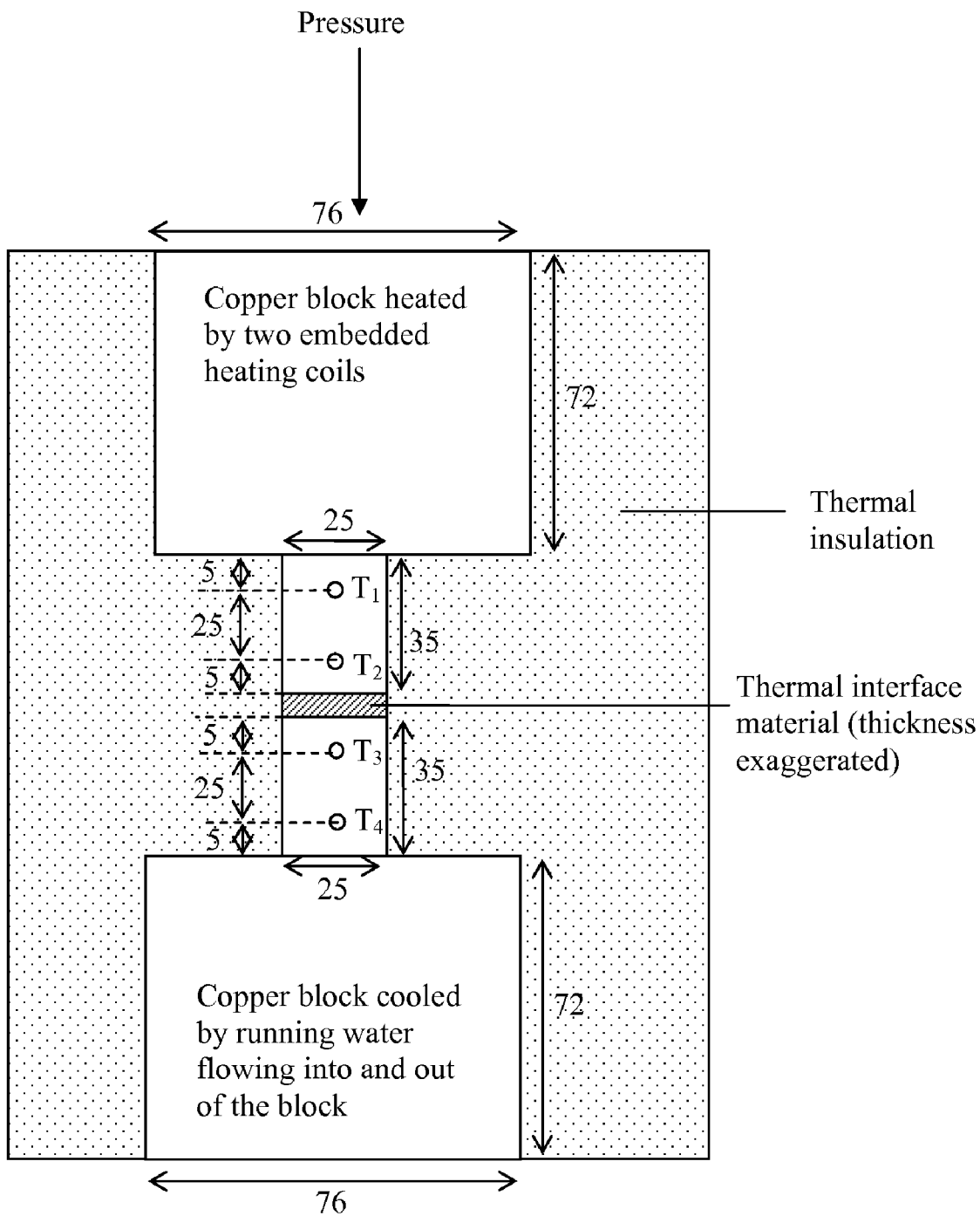
FIG. 3 is a schematic representation of the steady-state method (guarded hot plate method) of thermal contact conductance measurement in accordance with the present invention. $T_1$, $T_2$, $T_3$ and $T_4$ in the drawing are holes of diameter 2.4 mm. A thermocouple (Type T) is inserted in each hole. All dimensions are in mm.

The thermal contact conductance between two 1×1 inch (25×25 mm) copper blocks with a thermal interface material between them was measured using the guarded hot plate method, which is a steady-state method of heat flux measurement (ASTM Method D5470). The heat in this test was provided by a 3×3 inch (76×76 mm) copper block that had two embedded heating coils (top block in FIG. 3). During the period of temperature rise, the heating rate was controlled at 3.2° C./min by using a temperature controller. This copper block was in contact with one of the 1×1 inch copper blocks that sandwiched the thermal interface material. The cooling in this test was provided by a second 3×3 inch copper block, which was cooled by running water that flowed into and out of the block (bottom block in FIG. 3). This block was in contact with the other of the two 1×1 inch copper blocks that sandwiched the thermal interface material. The two mating surfaces of the two 1×1 in copper blocks were either "rough" (15 μm roughness, as attained by mechanical polishing) or "smooth" (0.009 μm roughness and 0.040-0.116 μm flatness, as attained by diamond turning). Four thermocouples (Type T) were inserted in four holes ($T_1$, $T_2$, $T_3$ and $T_4$ in FIG. 3, each hole of diameter 2.4 mm). Two of the four holes were in each of the 1×1 inch copper blocks. The temperature gradient was determined from $T_1$-$T_2$ and $T_3$-$T_4$. These two quantities should be equal at equilibrium, which was attained after holding the temperature of the heater at the desired value for 30 min. Equilibrium was assumed when the temperature variation was within ±0.1° C. in a period of 15 min. At equilibrium, the temperature of the hot block was in the range 75-80° C., that of the cold block was in the range 10-15° C., while that of the thermal interface material was in the range 40-50° C. The pressure in the direction perpendicular to the plane of the thermal interface was controlled by using a hydraulic press at pressures of 0.46, 0.69 and 0.92 MPa. The system was thermally insulated by wrapping laterally all the copper blocks with glass fiber cloth.

In accordance with ASTM Method D5470, the heat flow Q is given by $$Q = \frac{\lambda A}{d_A} \Delta T \qquad (1)$$

where $\Delta T = T_1 - T_2 = T_3 - T_4$, $\lambda$ is the thermal conductivity of copper, A is the area of the 1×1 in copper block, and $d_A$ is the distance between thermocouples $T_1$ and $T_2$ (i.e., 25 mm).

The temperature at the top surface of the thermal interface material is $T_A$, which is given by $$T_A = T_2 - \frac{d_B}{d_A}(T_1 - T_2), \qquad (2)$$

where $d_B$ is the distance between thermocouple $T_2$ and the top surface of the thermal interface material (i.e., 5 mm). The temperature at the bottom surface of the thermal interface material is $T_D$, which is given by $$T_D = T_3 + \frac{d_D}{d_C}(T_3 - T_4), \qquad (3)$$

where $d_D$ is the distance between thermocouple $T_3$ and the bottom surface of the thermal interface material (i.e., 5 mm) and $d_C$ is the distance between thermocouples $T_3$ and $T_4$ (i.e., 25 mm).

The thermal impedance θ is given by $$\theta = (T_A - T_D)\frac{A}{Q} \qquad (4)$$

Note than insertion of Eq. (1) into Eq. (4) causes cancellation of the term A, so that θ is independent of A. The thermal contact conductance is the reciprocal of θ.

Example 4

Thermal Interface Material Effectiveness Testing by Using a Computer Microprocessor Under Operation Microelectronic cooling, such as the cooling of computers, is one of the main applications of thermal interface materials. Thus, application-oriented testing using a computer is useful. However, the roughness, flatness and degree of alignment of various combinations of microprocessor and heat sink differ. Moreover, the method and force of fastening the heat sink to the microprocessor differ from computer to computer. Therefore, the results of a comparative study of various thermal interface materials using a computer only apply to that particular computer. From a scientific point of view, the results of testing using a computer are less meaningful than those obtained using a heat flux tester (whether a transient method or a steady-state method). Nevertheless, from an application point of view, testing using a computer is meaningful. By using the microprocessor of a computer under operation as the heat source, which is connected to a heat sink via a thermal interface material at the interface between the two surfaces, the effectiveness of the thermal interface material can be evaluated. This involves measurement of the temperature rise after a fixed time of operation of the computer at various choices of thermal interface material.

Figure 4:
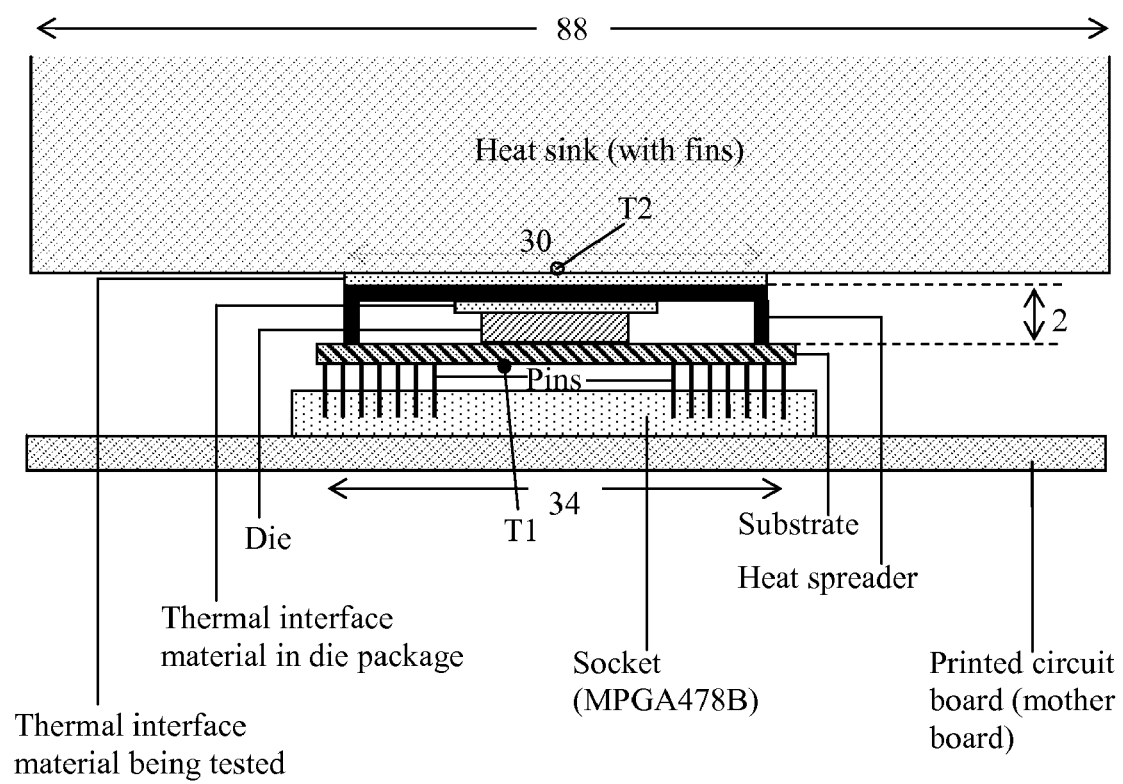
FIG. 4 is a schematic representation of the experimental set-up for application-oriented testing of various thermal interface materials. The testing involves measuring the temperature rise of a computer microprocessor that utilizes various thermal interface materials for its cooling. T1 and T2 are thermocouples. All dimensions are in mm.

The computer used had an Intel Pentium IV flip chip pin-grid array 2 (FC-PGA2) microprocessor (processor core frequency 1.7 GHz, system bus frequency 400 MHz, L2 cache size 256 Kbytes, core voltage 1.75 V) in a 478-pin package, which was integrated with a heat spreader (area=960 mm$^2$) made of nickel coated copper. The pins, which were made of Au/Ni plated Kovar (metal alloy), were inserted in a socket that was made of a fiber-reinforced polymer (resin). The thermal interface material under evaluation was placed at the interface between the heat spreader (30×30 mm) and an aluminum heat sink (area of 88×64 mm), as illustrated in FIG. 4.

Figure 5:
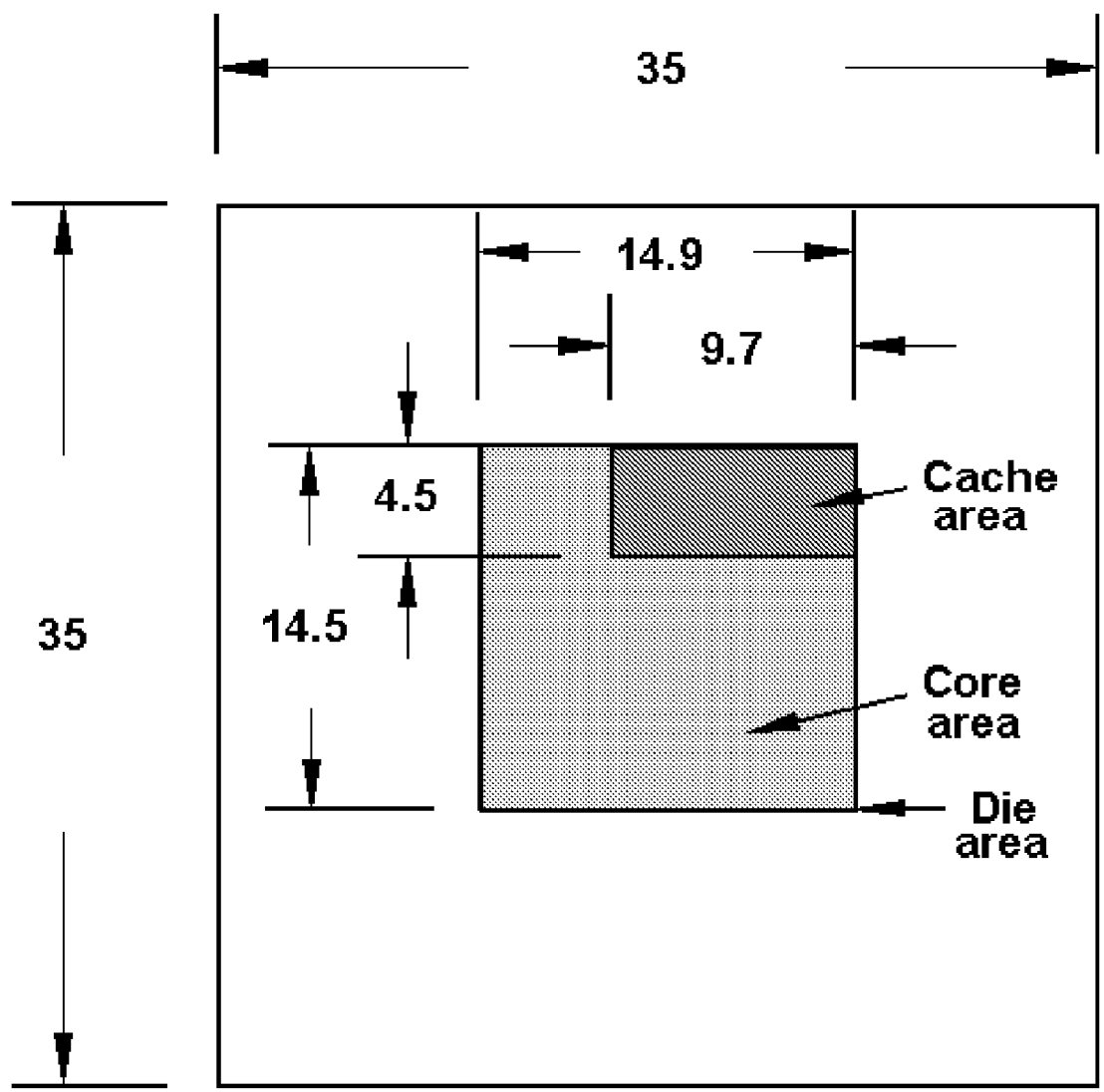
FIG. 5 is a schematic representation of the functional die layout for the computer used for application-oriented testing of various thermal interface materials. All dimensions are in mm and were obtained from a photograph of the die.

A microprocessor die consists of two areas, namely the processor core and the cache. While the entire die generates heat, the active area of heat dissipation is essentially the processor core area. FIG. 5 illustrates the relative areas of core and cache on a die, as estimated by examining a photograph of each of the dies. The processor core area occupies approximately 80% of the die area.

The maximum temperature difference across the interface between the microprocessor and heat sink surfaces, as obtained by two thermocouples (Type T), was measured as a function of time from the start of operation of the microprocessor. The microprocessor temperature increased with time, causing the temperature difference between the two thermocouples to change with time. The temperature difference at time=5 min was used for the comparative study of the performance of thermal interface materials. The smaller is the temperature difference, the less is the thermal resistance and the better is the performance.

Example 5

Specific Heat Testing

The specific heat relates to the heat absorption ability. The absorption of heat by a thermal interface material provides an additional of heat removal. The specific heat of a thermal interface material was measured by calorimetry, using a differential scanning calorimeter (DSC 7, Perkin-Elmer Corp, Shelton, Conn.). A sapphire disk (Specific heat kit, 02190136 Perkin-Elmer Corp, Shelton, Conn.) was used as a standard specimen and the specific heat of the paste specimen being tested was calculated using the equation $$C_{ps}=(M_r/M_s)(H/h)C_{pr}, \qquad (5)$$

where $C_{ps}$ is the specific heat of the specimen being tested, $C_{pr}$ is the specific heat of standard specimen, $M_r$ is the mass of standard specimen, $M_s$ is the mass of the paste specimen being tested, H is the difference in heat flow between the paste specimen and the baseline, and h is the difference in heat flow between the standard specimen and the baseline. Three specimens of each type of thermal interface material were tested.

Example 6

Surface Roughness Testing

The roughness of the proximate surfaces that sandwich a thermal interface material affects the performance of the thermal interface material, as shown in this invention. The surface roughness of the computer heat sink (used in Example 4), computer microprocessor package (integrated heat spreader, used in Example 4) and each of the two copper surfaces sandwiching the thermal interface material during contact conductance measurement (used in Example 3) was measured by using a surface roughness tester (Surftest SJ-201P, Mitutoyo America Corp., Aurora, Ill.). The tester is a profilometer. The stylus tip material is diamond. The stylus tip radius is 5 µm. The measuring force is 4 mN. The measuring speed is 0.02 in/s (0.5 mm/s).

Example 7

Conformability Testing

The conformability of a thermal interface material affects the performance of the thermal interface material, as shown in this invention. There is no standard or established method of conformability testing. Therefore, this example uses penetration testing as a form of conformability testing.

Figure 6:
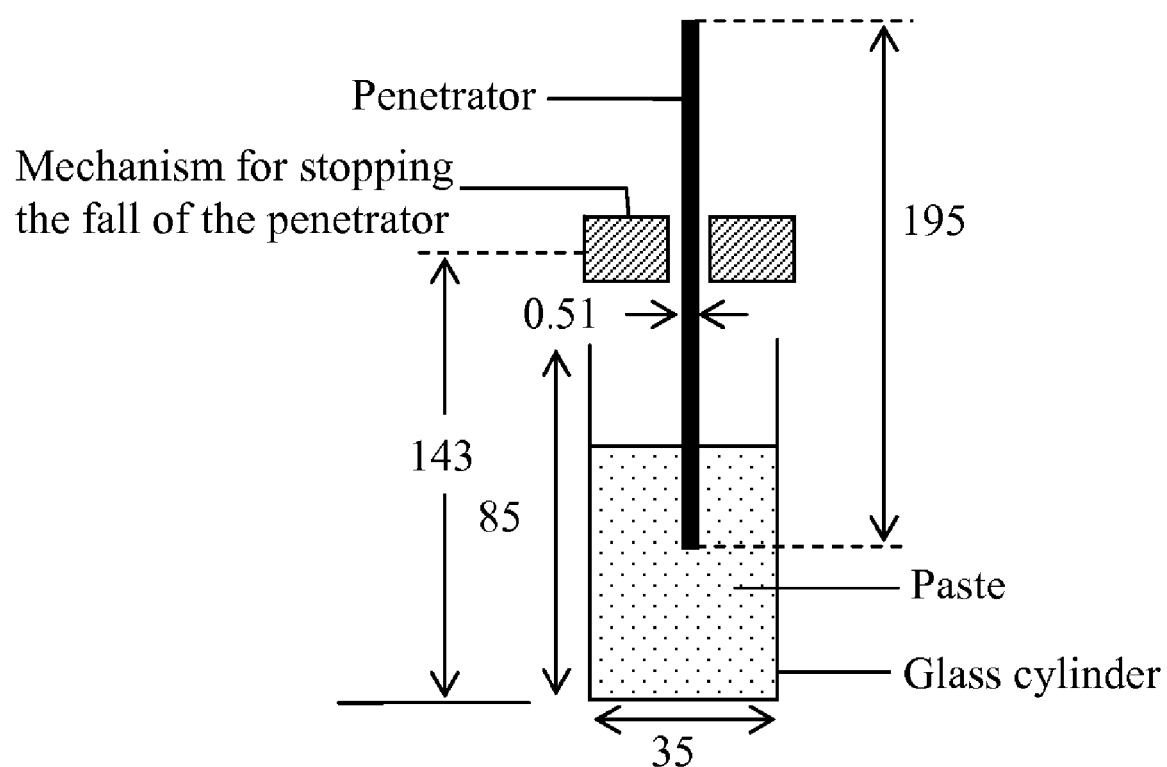
FIG. 6 is a schematic representation of the method of penetration testing for assessing the conformability of a paste. All dimensions are in mm.

FIG. 6 illustrates the penetration testing instrument, which is a gravity-penetrometer based on ASTM D 1321-97. The penetrator (a 15-5 precipitation hardened stainless steel rod of diameter 0.51 mm, length 195 mm and mass 0.33 g) was precisely lowered to the surface of the paste under test. Then it was allowed to sink into the paste by its own weight during a defined test duration (5 seconds in this work). The penetration was indicated by the extent of vertical movement of the penetrator, as measured by calipers. The instrument in this work used a timer to control the test duration of 5 seconds. A solenoid connected to the timer was used to activate a simple mechanism for stopping the fall of the penetrator exactly at the end of 5 seconds. Each specimen was tested for three times.

Example 8

Viscosity Testing

The viscosity describes the resistance to shear deformation. It is a commonly used attribute for describing pastes. The viscosity of various pastes was measured by using a viscometer (Brookfield Engineering Laboratories, Inc., Middleboro, Mass., Model LVT Dial-Reading Viscometer, with Model SSA-18/13R Small Sample Adaptor).

Example 9

Thermal Stability Testing

The thermal stability refers to the ability to resist elevated temperatures. It is necessary for a thermal interface material to be able to resist the elevated temperatures involved in the particular application environment. The thermal stability of various pastes was tested by thermogravimetry, as conducted by heating in air from room temperature to 150° C. at a rate of 2° C./min. A Perkin Elmer (Newark, Conn.) TGA7 instrument was used.

Example 10

Evaluation of Thermal Contact Conductance for Thermal Pastes

This example pertains to evaluation of various thermal interface materials in terms of the thermal contact conductance across copper surfaces. The data that describe the performance of the interface materials are given in this example. The thermal interface materials evaluated include those formulated in this work as well as commercial thermal interface materials. The testing uses the methods described in Examples 2 and 3.

Table 1 gives thermal contact conductance (obtained by using the testing method described in Example 2) for various thermal pastes (containing 0 to 3.20 vol. % carbon black) between copper surfaces of roughness 0.05 µm at various contact pressures. The paste was below 25 µm in thickness. As seen in Table 1, without carbon black, the optimum ethyl cellulose content for attaining high thermal contact conductance using PEG as the vehicle base was 5 vol. %. The conductance was less when the ethyl cellulose content was below or above this value. This is attributed to the increase in both conductivity and viscosity provided by the ethyl cellulose. The conductivity helped the contact conductance, thus causing the conductance to increase as the cellulose content increased from 0 to 5 vol. %. On the other hand, the viscosity was detrimental to the contact conductance, thus causing the conductance to decrease as the cellulose content increased from 5 to 15 vol. %.

The addition of carbon black to PEG containing 3 vol. % ethyl cellulose increased the contact conductance, provided that the carbon black content was 1.25 vol. % or below (Table 1). Exceeding this content caused the contact conductance to drop, as shown for a carbon black content of 1.5 vol. %, which gave even lower conductance than the case without carbon black. In the case of PEG containing 5 vol. % ethyl cellulose, the conductance was diminished greatly by the carbon black addition (even just 0.5 vol. % carbon black). This is attributed to the resulting high viscosity when ethyl cellulose was present at 5 vol. % and the further increase in viscosity upon the carbon black addition. The viscosity results are described in Example 16. Among the PEG based pastes, the highest contact conductance of $3.0 \times 10^5$ W/m$^2$.° C. was attained by using 3 vol. % ethyl cellulose and 1.25 vol. % carbon black.

with carbon black content from 0 to 0.20 vol. % and decreased with carbon black content from 0.20 to 0.53 vol. %. The optimum carbon black content 0.20 vol. %, at which conductance reached $2.8 \times 10^5$ W/m$^2$.° C.

For pastes based on PEG (with 3 vol. % ethyl cellulose) and butyl ether (with 40 vol. % ethyl cellulose), the conductance

TABLE 1

| Thermal interface material | | | Conductance ($10^4$ W/m$^2 \cdot$ ° C.) | | |
|---|---|---|---|---|---|
| Vehicle | Vol. % EC | Vol. % CB | 0.46 MPa | 0.69 MPa | 0.92 MPa |
| PEG | 0 | 0 | 11.00 ± 0.30 | — | — |
| PEG | 3 | 0 | 12.02 ± 0.86 | 13.98 ± 1.06 | 15.57 ± 1.03 |
| PEG | 5 | 0 | 18.51 ± 0.83 | 18.92 ± 0.91 | 20.74 ± 1.52 |
| PEG | 7.5 | 0 | 17.61 ± 0.11 | 17.60 ± 0.75 | 19.21 ± 0.79 |
| PEG | 10 | 0 | 12.31 ± 0.52 | 12.29 ± 0.61 | 14.69 ± 0.80 |
| PEG | 15 | 0 | 4.14 ± 0.25 | 4.41 ± 0.07 | 4.59 ± 0.33 |
| PEG | 3 | 0 | 12.02 ± 0.86 | 13.98 ± 1.06 | 15.57 ± 1.03 |
| PEG | 3 | 0.50 | 15.45 ± 0.94 | 17.67 ± 1.09 | 19.10 ± 0.43 |
| PEG | 3 | 1.00 | 18.83 ± 1.08 | 19.41 ± 1.38 | 22.81 ± 1.12 |
| PEG | 3 | 1.25 | 29.90 ± 0.79 | 28.98 ± 2.11 | 29.63 ± 1.92 |
| PEG | 3 | 1.50 | 9.92 ± 0.57 | 11.50 ± 0.90 | 12.29 ± 1.06 |
| PEG | 5 | 0 | 18.51 ± 0.83 | 18.92 ± 0.91 | 20.74 ± 1.52 |
| PEG | 5 | 0.50 | 9.00 ± 0.14 | 13.16 ± 0.19 | 13.28 ± 0.07 |
| PEG | 5 | 0.75 | 11.71 ± 0.44 | 12.90 ± 0.31 | 14.83 ± 0.63 |
| PEG | 5 | 1.00 | 10.61 ± 0.20 | 11.45 ± 0.33 | 11.61 ± 0.50 |
| BE | 0 | 0 | 2.89 ± 0.10 | — | 3.86 ± 0.08 |
| BE | 10 | 0 | 3.65 ± 0.13 | 4.55 ± 0.21 | 5.68 ± 0.06 |
| BE | 20 | 0 | 3.70 ± 0.08 | 5.11 ± 0.05 | 6.40 ± 0.11 |
| BE | 30 | 0 | 4.60 ± 0.28 | 5.08 ± 0.15 | 5.54 ± 0.21 |
| BE | 40 | 0 | 3.67 ± 0.13 | 4.37 ± 0.12 | 4.61 ± 0.06 |
| BE | 0 | 0 | 2.89 ± 0.10 | — | 3.86 ± 0.08 |
| BE | 0 | 1.34 | 2.14 ± 0.08 | — | 3.75 ± 0.06 |
| BE | 0 | 2.14 | 2.85 ± 0.04 | — | 3.08 ± 0.08 |
| BE | 0 | 2.67 | 1.64 ± 0.10 | — | 2.37 ± 0.0+ |
| BE | 0 | 3.20 | 1.62 ± 0.07 | — | 2.32 ± 0.06 |
| BE | 10 | 0 | 3.65 ± 0.13 | 4.55 ± 0.21 | 5.68 ± 0.06 |
| BE | 10 | 0.53 | 1.10 ± 0.06 | 2.99 ± 0.06 | 4.42 ± 0.06 |
| BE | 10 | 1.34 | 4.53 ± 0.15 | 5.35 ± 0.19 | 5.43 ± 0.31 |
| BE | 10 | 2.14 | 3.75 ± 0.11 | 4.64 ± 0.22 | 4.75 ± 0.17 |
| BE | 10 | 2.67 | 1.75 ± 0.05 | 2.75 ± 0.06 | 4.05 ± 0.18 |
| BE | 20 | 0 | 3.70 ± 0.08 | 5.11 ± 0.05 | 6.40 ± 0.01 |
| BE | 20 | 0.53 | 4.02 ± 0.13 | 5.17 ± 0.09 | 5.47 ± 0.28 |
| BE | 20 | 1.34 | 4.13 ± 0.13 | 5.25 ± 0.16 | 5.52 ± 0.11 |
| BE | 20 | 2.14 | 5.00 ± 0.17 | 5.39 ± 0.13 | 5.64 ± 0.20 |
| BE | 20 | 2.67 | 1.08 ± 0.07 | 1.13 ± 0.03 | 1.45 ± 0.03 |
| BE | 30 | 0 | 4.60 ± 0.28 | 5.08 ± 0.15 | 5.54 ± 0.21 |
| BE | 30 | 0.27 | 3.41 ± 0.14 | 3.94 ± 0.10 | 4.17 ± 0.05 |
| BE | 30 | 0.53 | 4.23 ± 0.16 | 5.60 ± 0.22 | 6.62 ± 0.32 |
| BE | 30 | 1.07 | 1.65 ± 0.02 | 2.13 ± 0.05 | 2.88 ± 0.07 |
| BE | 40 | 0 | 3.67 ± 0.13 | 4.37 ± 0.12 | 4.61 ± 0.06 |
| BE | 40 | 0.10 | 10.90 ± 1.10 | 16.19 ± 1.02 | 16.93 ± 0.12 |
| BE | 40 | 0.20 | 27.43 ± 2.75 | 28.41 ± 2.12 | 28.03 ± 1.57 |
| BE | 40 | 0.27 | 18.94 ± 0.60 | 24.87 ± 1.00 | 25.74 ± 1.20 |
| BE | 40 | 0.30 | 13.62 ± 1.32 | 17.05 ± 1.26 | 18.54 ± 1.53 |
| BE | 40 | 0.40 | 6.02 ± 0.58 | 7.68 ± 0.10 | 9.56 ± 0.62 |
| BE | 40 | 0.53 | 4.95 ± 0.15 | 5.58 ± 0.17 | 5.55 ± 0.11 |

EC = ethyl cellulose
CB = carbon black
PEG = polyethylene glycol
BE = di(ethylene glycol) butyl ether Referring again to Table 1, it is seen that for butyl ether without carbon black, the optimum ethyl cellulose content for attaining high contact conductance was 30 vol. % when the contact pressure was 0.46 MPa and was 20 vol. % when the pressure was 0.69 or 0.92 MPa. Due to its low viscosity, butyl ether dissolved ethyl cellulose powder more easily than did PEG. However, the conductance attained by butyl ether, whether with or without ethyl cellulose, is lower than that attained by PEG, whether with or without carbon black.

The addition of carbon black to butyl ether had little effect on the contact conductance, unless the ethyl cellulose content was high (40 vol. %). In this case, the conductance increased was maximum at an intermediate content of carbon black. This trend had been previously reported for boron nitride particle pastes based on lithium doped PEG. Xu, Luo and Chung, *J. Electron. Pkg.*, 124: 188-191 (2002), which is hereby incorporated by reference in its entirety. It is attributed to the required compromise between thermal conductivity and viscosity, both of which increase with increasing solid content. The viscosity results are described in Example 16.

The highest conductance attained by PEG-based and butyl ether-based pastes is similar. However, the optimum carbon black content is much higher for the PEG-based paste and the optimum ethyl cellulose content is much lower for the PEG-based paste. Due to the importance of a low viscosity, the use of a high ethyl cellulose content requires that of a low carbon black content, and the use of a high carbon black content requires that of a low ethyl cellulose content.

Table 2 gives thermal contact conductance (obtained using the testing method described in Example 2) for thermal pastes in the form of di(ethylene glycol) butyl ether (referred to as butyl ether) containing 40 vol. % ethyl cellulose and 0.27 vol. % thermally conductive solids, as tested between copper disks at various contact pressures. Various types of thermally conductive solid at the same volume fraction of 0.27% were used to form pastes with the same vehicle for the sake of comparison of the effectiveness of various thermally conductive solids. In the conductance testing, the paste was below 25 μm in thickness.

TABLE 2

| Thermally conductive solid component | Conductance ($10^4$ W/m² · ° C.) | | |
|---|---|---|---|
| | 0.46 MPa | 0.69 MPa | 0.92 MPa |
| Carbon black | 18.94 ± 0.60 | 24.87 ± 1.00 | 25.74 ± 1.20 |
| Graphite (5 μm) | 3.03 ± 0.09 | 3.67 ± 0.08 | 4.02 ± 0.12 |
| Graphite (1 μm) | 1.52 ± 0.03 | 1.77 ± 0.04 | 2.04 ± 0.05 |
| Nickel (3 μm) | 1.85 ± 0.05 | 2.14 ± 0.02 | 2.84 ± 0.04 |
| Nickel (1 μm) | 0.91 ± 0.07 | 2.03 ± 0.10 | 2.66 ± 0.03 |
| Diamond (25 μm) | 1.15 ± 0.02 | 1.21 ± 0.09 | 1.54 ± 0.03 |
| Carbon filaments (0.1 μm diameter) | 1.09 ± 0.03 | 1.32 ± 0.02 | 1.51 ± 0.03 |
| Single-walled carbon nanotubes | 13.5 ± 0.2 | 13.8 ± 0.3 | 14.1 ± 0.4 |

Table 2 shows that carbon black is a much more effective conductive additive than graphite, nickel and diamond particles and carbon filaments, for it provides a thermal paste that gives an exceptionally high thermal contact conductance. The superiority of carbon black occurs in spite of the relatively low thermal conductivity of carbon black. It is attributed to the conformability and spreadability of the paste, as enhanced by the compressibility of the carbon black agglomerates.

Electrical connectivity refers to the extent of formation of a continuous electrically conductive path. Thermal connectivity refers to the extent of formation of a continuous thermally conductive path. The electrical conductivity of various materials can differ much more than the thermal conductivity of various materials. Therefore, the attainment of electrical connectivity of a high electrical conductivity filler in a matrix of a low electrical conductivity component tends to be clearer than the attainment of thermal connectivity of a high thermal conductivity filler in a matrix of a low thermal conductivity component. Moreover, defects such as voids can affect electrical connectivity and thermal connectivity to different extents. For a filler that is high in both electrical conductivity and thermal conductivity, electrical connectivity does not imply thermal connectivity.

The compressibility of carbon black (in solid form rather than the form of a paste) and the consequent electrical connectivity (to be distinguished from thermal connectivity) attained upon squeezing have been previously suggested in the context of a microstructured solid composite material with carbon black as one of the distributed solid components. In particular, as a distributed electrically conductive additive to a non-conductive $MnO_2$ particle solid cathode of an electrochemical cell, carbon black resulted in a lower electrical resistivity than carbon filament (also known as carbon nanofiber) without graphitization (same as the carbon filament used in this work), due to the squeezing of the carbon black between adjacent $MnO_2$ particles in the microstructured solid composite material. Frysz, Shui and Chung, *J. Power Sources* 58:41-54 (1996); Lu and Chung, *Carbon* 40:447-449 (2002), which are hereby incorporated by reference in their entirety. However, the compressibility (more exactly, the squishability, due to the high degree of compressibility) of carbon black is a notion has not been previously applied to the development of a conformable paste. Moreover, this notion has not been previously applied to the development of a material in which carbon black is the only solid component. Furthermore, this notion has not been previously applied to the development of a material to be used at the interface between two macroscopic surfaces.

In contrast to carbon black, the other conductive solids (fillers) investigated are not squishable. A single-walled carbon nanotube is even smaller is size than a carbon black particle. A small size enhances the ability to fill the microscopic valleys in the surface topography of the mating surfaces. The ability to fill the valleys pertains to conformability. Furthermore, single-walled carbon nanotubes are good thermal conductors along the axis of the nanotube. In spite of the small size and thermal conductivity of a carbon nanotube, the carbon nanotube paste is inferior to the carbon black paste as a thermal contact enhancing interface material (Table 2). This is due to the squishability and the consequent conformability and spreadability of carbon black. Carbon nanotubes are not squishable. Comparison of the performance of the carbon nanotube paste and the carbon black paste indicates that the importance of conformability and spreadability in governing thermal paste performance.

The use of solder in place of a thermal paste gave a thermal contact conductance of $(2.01 \pm 0.06) \times 10^5$ W/m². ° C. This value is consistent with that previously reported in the literature for the same testing method and configuration. Xu, Luo and Chung, *J. Electron. Pkg.* 124: 188-191 (2002). Thus, the optimized carbon black pastes of the present invention are significantly superior to solder as thermal interface materials.

The limited effectiveness of solder occurs in spite of the high thermal conductivity of solder. This is partly due to the reaction between solder (which contains tin) and the copper disks. This reaction results in copper-tin intermetallic compounds at the solder-copper interface. Grivas et al., *J. Electron Mater.* 15:355-359 (1986); Tu, *Mater. Chem. Phys.* 46:217-223 (1996); Tsutsumi et al., *Int. J. Hybrid Microelec.* 7:38-43 (1984), which are hereby incorporated by reference in their entirety. The compound formation causes the solder to not wet the copper surface. Kim et al., *Mat. Res. Soc. Symp. Proc.*, Vol. 390, p.183-188 (1995), which is hereby incorporated by reference in its entirety. This leads to increased difficulty of the solder to conform to the surface topography of the copper.

Solder, being metallic, is more conductive than carbon, which is not a metal. The low effectiveness of solder as a thermal interface material compared to the optimized carbon black pastes of the present invention supports the notion that conformability and spreadability are more important than thermal conductivity in governing the performance of a thermal interface material of a sufficiently small thickness. An example of a sufficiently small thickness is 25 μm. The greater is the thickness, the more important is the thermal conductivity within the thermal interface material.

The thermal contact conductance values reported herein for the paste formulations (Tables 1 and 2) and solder as thermal interface materials were all obtained using the same specimen configuration, testing method and data analysis algorithm, and the values are most reliable on a relative scale. This means that the comparative evaluation provided in this example is highly reliable. However, values for individual cases may deviate from the true values, due to the fact that the data analysis algorithm neglects the thickness of the thermal interface material. Luo and Chung, *Int. J. Microcircuits Electron. Pkg.* 24:141-147 (2001), which is hereby incorporated by reference in its entirety.

The use of PEG by itself gives a thermal contact conductance of $1.1 \times 10^5$ W/m$^2$·° C.; the dissolution of ethyl cellulose at an optimum concentration of 5 vol. % increases the conductance to $1.9 \times 10^5$ W/m$^2$·° C. The use of butyl ether by itself gives a contact conductance of $3 \times 10^4$ W/m$^2$·° C.; the dissolution of ethyl cellulose at the optimum concentration of 20 to 30 vol. % gives a conductance ranging from $4 \times 10^4$ to $6 \times 10^4$ W/m$^2$·° C.

The addition of carbon black to PEG helps the conductance when the ethyl cellulose is at 3 vol. % and the carbon black content is at 1.25 vol. % or below. The addition of carbon black to PEG degrades the conductance when the ethyl cellulose is at 3 vol. % and carbon black is at 1.5 vol. %, or when the ethyl cellulose is at 5 vol. %. These effects are due to the importance of conformability and spreadability to the thermal paste performance. Both carbon black and ethyl cellulose cause the viscosity of the paste to increase, so excessive amounts of these ingredients degrade the conductance.

The optimum carbon black content is higher for PEG-based pastes than butyl-ether-based pastes, whereas the optimum ethyl cellulose content is higher for butyl ether than PEG. In spite of the difference in carbon black content, the thermal contact conductance is similar between the optimized PEG-based paste and the optimized butyl-ether-based paste. Since carbon black is the ingredient in the paste that is most conductive thermally, this implies that the conformability and spreadability are more important than the thermal conductivity in governing thermal paste performance.

Moreover, in spite of its own relatively low thermal conductivity, carbon black is much more effective than graphite, nickel and diamond particles and carbon filaments, all evaluated at the same volume fraction, for providing thermal pastes. This is attributed to the compressibility of a carbon black agglomerate and the consequent conformability and spreadability of the paste.

Table 3 shows comparison of the thermal contact enhancing effectiveness (evaluated by using the method described in Example 2) of carbon black pastes, combinations of carbon black paste and silver paste and a combination of carbon black paste and ceramic paste. The carbon black pastes are fluidic pastes with either polyethylene glycol (with dissolved ethyl cellulose) or butyl ether (with dissolved ethyl cellulose) as the vehicle.

TABLE 3

Thermal contact conductance for various combinations of thermal paste composition, proximate surface smoothness and contact pressure. Smooth: 0.05 µm; rough: 15 µm.

| Thermal paste | Surface smoothness | Conductance (10$^4$ W/m$^2$·° C.) | | |
|---|---|---|---|---|
| | | 0.46 MPa | 0.69 MPa | 0.92 MPa |
| Carbon[a] | Smooth | 29.90 ± 0.79 | 28.98 ± 2.11 | 29.63 ± 1.92 |
| Carbon[b] | Smooth | 27.43 ± 2.75 | 28.41 ± 2.12 | 28.03 ± 1.57 |
| Arctic Silver 3 | Smooth | 13.05 ± 0.90 | 11.65 ± 1.02 | 10.82 ± 0.73 |
| Arctic Silver 5 | Smooth | 17.72 ± 0.23 | 16.78 ± 0.32 | 17.29 ± 0.86 |
| Ceramique | Smooth | 21.48 ± 1.12 | 24.10 ± 0.76 | 25.59 ± 0.96 |
| Carbon-silver[c] mixture[a] | Smooth | 17.86 ± 1.43 | 21.54 ± 2.36 | 23.30 ± 3.00 |
| Carbon[a] | Rough | 4.85 ± 0.13 | 5.17 ± 0.04 | 5.28 ± 0.22 |
| Arctic Silver 3 | Rough | 6.15 ± 0.65 | 6.80 ± 0.50 | 6.22 ± 0.26 |
| Arctic Silver 5 | Rough | 9.79 ± 1.01 | 10.21 ± 0.69 | 8.63 ± 0.37 |
| Ceramique[a] | Rough | 7.21 ± 0.10 | 8.47 ± 0.53 | 9.92 ± 0.41 |
| Carbon-silver[c] mixture[a] | Rough | 11.45 ± 0.82 | 12.89 ± 1.03 | 14.35 ± 1.00 |
| Carbon-silver[c] bilayer[a] | Rough | 17.06 ± 0.44 | 17.22 ± 0.79 | 19.61 ± 0.83 |
| Carbon-silver[d] bilayer[a] | Rough | 21.18 ± 1.64 | 20.39 ± 1.39 | 23.08 ± 1.24 |
| Carbon-Ceramique bilayer[a] | Rough | 11.62 ± 0.78 | 14.19 ± 1.44 | 17.06 ± 0.46 |

[a]PEG as vehicle, with 3 vol. % ethyl cellulose and 1.25 vol. % carbon black
[b]Di(ethylene glycol) butyl ether as vehicle, with 40 vol. % ethyl cellulose and 0.20 vol. % carbon black
[c]Arctic Silver 3, a commercial silver paste.
[d]Arctic Silver 5, a commercial silver paste.

Table 3 gives the thermal contact conductance values obtained for various combinations of thermal contact enhancing interface material composition, mating surface smoothness and contact pressure (pressure during testing). For the case of smooth (0.05 µm roughness, as attained by mechanical polishing using 0.05 µm alumina particles) mating surfaces, the conductance is highest for the carbon black dispersion and lowest for Arctic Silver 3 (a commercial silver paste). Arctic Silver 5 (another commercial silver paste) is superior to Arctic Silver 3, but inferior to the carbon-silver mixture (mixture of carbon black paste and silver paste, as described in Example 1). Ceramique (a commercial ceramic particle paste) is even better than the carbon-silver mixture, but is inferior to carbon.

For the case of rough mating surfaces (15 µm roughness, as attained by mechanical polishing using 15 µm silicon carbide particles), the conductance is highest for the carbon-silver bilayer involving Arctic Silver 5. The superiority of the carbon-silver bilayer involving Arctic Silver 5 to that involving Arctic Silver 3 is consistent with the superiority of Arctic Silver 5 to Arctic Silver 3. Both bilayers are more effective than the carbon-silver mixture, which is in turn more effective than Ceramique, Arctic Silver 3 or Arctic Silver 5. The carbon-ceramic bilayer is superior to Ceramique and to the carbon-silver mixture, but is inferior to both types of carbon-silver bilayer. For the case of rough mating surfaces, carbon is the worst, but synergistic use of carbon and silver results in the best performance.

As shown in Table 3, the highest conductance attained for rough proximate surfaces by using carbon-silver bilayer (Arctic Silver 5) is lower than that attained for smooth surfaces by using carbon. Therefore, the use of smooth proximate surfaces is recommended.

The conductance increases with increasing contact pressure for Ceramique and carbon-silver mixture, whether the proximate surfaces are smooth or rough (Table 3). The pressure dependence is less for carbon, Arctic Silver 3 or Arctic Silver 5. In particular, for carbon, the conductance has negligible pressure dependence for smooth surfaces, but increases slightly with increasing pressure for rough surfaces. This behavior of carbon is probably due to the increase of the carbon black volume fraction as the pressure increases and the consequent increase in thermal conductivity of the thermal paste; the thermal conductivity within the paste is more important for rough surfaces than smooth surfaces.

The value for Ceramique in Table 3 is close to the value >2.0×10$^5$ W/m$^2$.° C. reported by the manufacturer. However, the value for Arctic Silver 5 in Table 3 is lower than the value >3.5×10$^5$ W/m$^2$.° C. reported by the manufacturer. The method used for thermal conductance measurement and its accuracy have not been revealed by the manufacturer.

The use of solder (63 Sn-36.65 Pb-0.35 Sb, applied in the molten state) in place of a thermal paste as a thermal interface material gave a thermal contact conductance of (2.01±0.06)× 10$^5$ W/m$^2$.° C. No pressure was applied during testing in the case of the solder. The carbon black pastes and Ceramique (Table 3) are superior to solder, but Arctic Silver 3 and Arctic Silver 5 are inferior to solder.

The superiority of the carbon black pastes to the commercial silver and ceramic pastes is attributed to the conformability of carbon black. That Ceramique is superior to Arctic Silver 3 or Arctic Silver 5 is probably due to the better conformability of Ceramique. The superiority of the carbon black dispersions to solder is attributed to the conformability of carbon black and to the products of the reaction between solder and copper.

The performance of thixotropic pastes with polyol esters as the vehicle is shown in Table 4, which gives the thermal contact conductance values (obtained by using the testing method described in Example 2) for various combinations of thermal paste composition, mating surface roughness and contact pressure. The various thermal paste compositions differ in the thermally conductive solid component. Carbon black, hexagonal boron nitride particles and graphite particles are the solid components used separately for the sake of comparison. In addition, the performance of Ceramique is included in Table 4 for the sake of comparison.

For both smooth (0.05 μm) and rough (15 μm) proximate surfaces, the conductance is highest for the paste containing 2.4 vol. % carbon black, as shown in Table 4. Among the three types of filler, carbon black is the most effective and hexagonal boron nitride (BN) is the least effective, in spite of the high BN volume fraction (14-18%) compared to the carbon black volume fraction (2.2-2.6%). Graphite is less effective than carbon black, in spite of its higher volume fraction and greater crystallinity.

Graphite is much more effective than hexagonal boron nitride (BN), in spite of its lower volume fraction (10.7-12.0%), as shown in Table 4. The different ranges of filler volume fraction for the different fillers reflect the different upper limits of the filler volume fraction for forming a workable paste. The effectiveness of any of the three fillers depends on the filler volume fraction. For carbon black as the filler, the thermal contact conductance is highest at the intermediate carbon black volume fraction of 2.4%. For BN as the filler, the conductance is highest at the lowest BN volume fraction of 14.0%. For graphite as the filler, the conductance is higher at the lower graphite volume fraction of 10.7%. These trends occur at any of the pressures. The variation of the conductance with pressure is relatively small. In most cases, the conductance increases slightly with increasing pressure.

For the same paste, the conductance is much lower for the rough surfaces than the smooth surface (Table 4). This is because of the thermal resistance within the paste and the increase of this resistance with increasing thickness of the paste. Nevertheless, the relative effectiveness of the three fillers remains the same for rough and smooth surfaces.

Comparison of the carbon black thixotropic paste (with polyol esters as the vehicle) data in Table 4 with the carbon black fluidic paste (with PEG or butyl ether as the vehicle) data in Tables 1 and 3 shows that the thermal performance is similar for these pastes. The highest thermal contact conductance attained is 3.0×10$^5$ W/m$^2$.° C. for both the thixotropic pastes and the fluidic pastes. This similarity is in spite of the relatively low fluidity of the thixotropic pastes. The observation that the fluidity of the vehicle has negligible influence on the carbon black paste performance is consistent with the observation that carbon black PEG-based paste and carbon black ether-based paste are similar in thermal effectiveness, in spite of the higher viscosity of the latter. However, the optimum carbon black volume fraction is different for these pastes. For the thixotropic pastes of this work, the optimum carbon black volume fraction is 2.4%. For the fluidic pastes that utilize a vehicle in the form of polyethylene glycol (PEG) with 3.0 vol. % dissolved ethyl cellulose, the optimum carbon black volume fraction is 1.25% (Table 1). For the fluidic pastes that utilize a vehicle in the form of butyl ether with 40

TABLE 4

Thermal contact conductance (10$^4$ W$^2$/m · ° C.) for various combinations of thermal paste composition, mating surface roughness and contact pressure. The vehicle is polyol esters.

| Filler | Smooth surfaces (0.05 μm) | | | Rough surfaces (15 μm) | | |
| --- | --- | --- | --- | --- | --- | --- |
| | 0.46 MPa | 0.69 MPa | 0.92 MPa | 0.46 MPa | 0.69 MPa | 0.92 MPa |
| 2.6 vol. % CB[a] | 19.05 ± 0.93 | 22.26 ± 1.34 | 23.38 ± 0.96 | | | |
| 2.4 vol. % CB[a] | 28.78 ± 1.02 | 30.03 ± 2.31 | 30.43 ± 1.25 | 8.73 ± 0.27 | 10.79 ± 0.45 | 11.26 ± 0.36 |
| 2.2 vol. % CB[a] | 22.52 ± 0.35 | 23.81 ± 1.00 | 22.81 ± 0.56 | | | |
| 18.0 vol. % BN[b] | 18.9 ± 0.8 | / | / | / | / | / |
| 18.0 vol. % BN[a] | 8.44 ± 0.35 | 7.14 ± 0.36 | 7.21 ± 0.22 | | | |
| 16.0 vol. % BN[a] | 8.86 ± 0.25 | 12.73 ± 0.33 | 11.11 ± 0.22 | | | |
| 14.0 vol. % BN[a] | 8.95 ± 0.32 | 11.80 ± 0.91 | 12.23 ± 0.81 | 2.89 ± 0.07 | 3.83 ± 0.11 | 4.79 ± 0.19 |
| 12.0 vol. % graphite[a] | 16.35 ± 0.59 | 19.58 ± 0.84 | 21.97 ± 1.21 | | | |
| 10.7 vol. % graphite[a] | 20.19 ± 1.64 | 25.84 ± 1.84 | 27.66 ± 1.19 | 8.28 ± 0.51 | 8.94 ± 0.27 | 8.46 ± 0.33 |
| Ceramique[c] | 21.48 ± 1.12 | 24.10 ± 0.76 | 25.59 ± 0.96 | 7.21 ± 0.10 | 8.47 ± 0.53 | 9.92 ± 0.41 |

[a]Thixotropic paste with polyol ester vehicle.
[b]Fluidic paste with lithium doped polyethylene glycol vehicle, from data in Xu et al., J. Electron. Packaging 124: 188-191 (2002).
[c]Commercial paste of Arctic Silver, Inc., with polyol ester vehicle.
CB = carbon black.
BN = hexagonal boron nitride.

vol. % dissolved ethyl cellulose, the optimum carbon black volume fraction is 0.20% (Table 1). The optimum filler content depends on the effects of the filler content on both the conformability and the thermal conductivity within the paste. Different vehicles are associated with different degrees of conformability, thus resulting in different values of the optimum filler content.

The thermal contact conductance is much lower for the thixotropic boron nitride (BN) pastes than the fluidic BN paste based on lithium doped polyethylene glycol (Xu, Luo and Chung, J. Electron. Packaging 124:188-191 (2002)), as shown in Table 4. The BN used by Xu et al. and in this work are identical in source, grade and volume fraction (18%). The higher conductance for the fluidic paste is probably due to the greater fluidity and the resulting higher conformability. The importance of fluidity or conformability to the thermal paste performance is also indicated by the fact that the BN paste decreases in thermal contact conductance as the BN content increases from 14 to 18 vol. % (Table 4).

That the boron nitride (BN) thixotropic paste is less effective than the BN fluidic paste, whereas the carbon black thixotropic paste is comparable in effectiveness to the carbon black fluidic paste is attributed to the large particle size of BN (5-11 μm) compared to carbon black (30 nm). In paste formulation, vehicle fluidity is more important for large particles than for small particles.

The thermal contact conductance is much lower for the thixotropic BN pastes of this work than some of those that are commercially available. For example, the paste known as Ceramique (Arctic Silver Inc., Visalia, Calif.) contains boron nitride, zinc oxide and aluminum oxide submicron particles, but without metal particles. Its thermal contact conductance is much higher than the BN pastes of this work for both smooth and rough surfaces (Table 4). The low conductance of the BN pastes of this work is attributed mainly to the large particle size of BN (5-11 μm) used in this work and the submicron particle size of BN used in Ceramique.

Tables 1-4 show that pressure applied at the thermal contact (i.e., pressure that squeezes the proximate surfaces together) during thermal contact conductance testing affects the performance of a thermal interface material. In most cases, the greater is the pressure, the higher is thermal contact conductance. This trend is due to the tightening of the interface by the pressure.

In practical application, the application of a substantial pressure to squeeze the proximate surfaces together may not be desirable or feasible. Therefore, application of pressure prior to use of the thermal contact is of interest for the purpose of improving the thermal contact. This means that the effect of pressure history on a thermal contact is of interest.

TABLE 5

Effect of pressure history on thermal contact conductance ($10^4$ W/m² · °C.) for smooth surfaces (0.05 μm roughness).

| Paste | History | 0.32 MPa→ | 0.46 MPa→ | 0.69 MPa→ | 0.32 MPa |
|---|---|---|---|---|---|
| Thixotropic[a] | 1 | 19.02 ± 0.57 | 28.78 ± 1.02 | / | 20.24 ± 0.71 |
| Thixotropic[a] | 2 | 19.02 ± 0.57 | / | 30.03 ± 2.31 | 25.04 ± 1.16 |
| Fluidic[b] | 1 | 21.85 ± 1.94 | 29.90 ± 0.79 | / | 23.08 ± 1.20 |
| Fluidic[b] | 2 | 21.85 ± 1.94 | / | 28.98 ± 2.11 | 26.76 ± 1.92 |

[a]Polyol ester vehicle with 2.4 vol. % carbon black.
[b]PEG vehicle with 3 vol. % ethyl cellulose and 1.25 vol. % carbon black.

Table 5 shows that prior application of a pressure above 0.32 MPa (specifically 0.46 MPa in History 1 and 0.69 MPa in History 2) helps increase the conductance at 0.32 MPa. The prior pressure is higher in History 2 than History 1. The higher is the prior pressure, the greater is the effect of the prior pressure application. The effect of prior pressure application is similar for the thixotropic and fluidic pastes, as shown in Table 5.

The effect of prior pressure application means that a high pressure does not have to be applied during the use of a carbon black thermal paste. The prior application of a relatively high pressure advantageously reduces the need for pressure application during use.

Example 11

Evaluation of Thermal Contact Conductance for Thermal Interface Material in the Form of a Sheet Coated on Both Sides with a Thermal Paste Thermal interface materials in the form of a sheet coated on both sides with a thermal paste are particularly useful as thermal gap-filling materials. Such materials tested in this work are listed in Table 6. They include materials prepared in this work and commercial materials. In Table 6, A denotes the flexible graphite of thickness 130 μm, B denotes copper foil (110 annealed) of thickness 13 μm, C denotes aluminum foil (1145) of thickness 7 μm, D denotes aluminum foil (1100) of thickness 130 μm, E denotes copper foil (110 annealed) of thickness 130 μm, F denotes Dow Coming Heat Path (silicone supported by a porous fiberglass sheet, TP 1070-B001-0250-0020) of thickness 200 μm, G denotes Chomerics Therm-A-Gap G580 (silicone filled with ceramic (mainly $Al_2O_3$) particles and supported by a porous fiberglass sheet) of thickness 510 μm, H denotes Chomerics Therm-A-Gap A580 (silicone filled with ceramic (mainly $Al_2O_3$) particles and supported by an aluminum sheet of thickness 76 μm; total thickness 510 μm) and I denotes Thermagon T-pli 210 (silicone pad filled with boron nitride particles, without a supporting sheet; thickness 250 μm). The thicknesses of the various materials were chosen based on commercial availability. In addition, for the sake of comparison, commercial gap-filling materials in the form of pastes were evaluated; they are Arctic Silver 5 (silver particle filled oils from Arctic Silver Inc., Visalia, Calif.) and Shin-Etsu X-23-7762 (aluminum particle filled silicone from Shin-Etsu MicroSi, Inc., Phoenix, Ariz.). All the copper and aluminum foils (not those in the commercial gap-filling materials) were obtained from All-foils, Inc., Brooklyn Heights, Ohio.

The coating labeled 1 in Table 6 is the carbon black thermal paste in fluidic form (based on polyethylene glycol, with 3 vol. % dissolved ethyl cellulose and 1.25 vol. % carbon black). The coating labeled 2 is the carbon black thermal paste in thixotropic form (based on polyol esters, with 2.4 vol. % carbon black). The coating labeled 3 is the Arctic Silver 5 commercial thermal paste. All coatings were of thickness 25 vm or less. The cost is similar for coatings 1 and 2, but is much higher for coating 3. This is due to the high cost of silver compared to carbon black. Furthermore, the volume fraction of silver in coating 3 is much higher than the volume fraction of carbon black in coating 1 or 2.

Each type of gap-filling material was tested for at least three times. Each time involved measurement at these pressures (0.46, 0.69 and 0.92 MPa) in increasing order.

Table 6 shows that, whether for rough (15 μm) or smooth (0.009 μm) surfaces, all without coating, flexible graphite (130 vm thick, without coating) is superior to thinner copper foil (13 vm thick, without coating) and is as effective as thinner aluminum foil (7 vm thick, without coating). This is due to the conformability of flexible graphite.

thickness is associated with higher effectiveness, as expected due to the thermal resistance within the foil along its thickness.

TABLE 6

Effectiveness of various thermal interface materials materials, as indicated by the thermal contact conductance ($10^4$ W/m$^2$ · ° C.) between copper surfaces.

| Thermal interface material | Rough (15 μm) | | | Smooth (0.009 μm) | | |
|---|---|---|---|---|---|---|
| | 0.46 MPa | 0.69 MPa | 0.92 MPa | 0.46 MPa | 0.69 MPa | 0.92 MPa |
| A(uncoated) | 1.40 ± 0.09 | 1.72 ± 0.12 | 2.08 ± 0.11 | 2.87 ± 0.14 | 3.16 ± 0.22 | 4.44 ± 0.36 |
| A(with coating 1) | 2.93 ± 0.09 | 3.16 ± 0.20 | 3.28 ± 0.12 | 4.15 ± 0.33 | 4.38 ± 0.37 | 5.04 ± 0.43 |
| A(with coating 2) | 2.34 ± 0.16 | 2.60 ± 0.19 | 2.94 ± 0.24 | 3.09 ± 0.16 | 3.21 ± 0.27 | 3.48 ± 0.29 |
| A(with coating 3) | 1.74 ± 0.15 | 1.88 ± 0.15 | 2.23 ± 0.19 | / | / | / |
| B(uncoated) | 0.78 ± 0.05 | 0.96 ± 0.07 | 1.27 ± 0.05 | 1.48 ± 0.12 | 1.91 ± 0.10 | 2.55 ± 0.19 |
| B(with coating 1) | 3.47 ± 0.17 | 3.73 ± 0.21 | 3.95 ± 0.29 | 13.72 ± 1.29 | 14.26 ± 1.17 | 15.07 ± 1.32 |
| C(uncoated) | 1.32 ± 0.06 | 1.81 ± 0.14 | 1.97 ± 0.11 | 2.89 ± 0.21 | 3.50 ± 0.25 | 4.77 ± 0.42 |
| C(with coating 1) | 3.67 ± 0.31 | 4.52 ± 0.39 | 5.22 ± 0.45 | 14.21 ± 1.31 | 15.18 ± 1.43 | 15.87 ± 1.56 |
| C(with coating 2) | 3.54 ± 0.30 | 3.85 ± 0.31 | 4.19 ± 0.37 | 6.22 ± 0.54 | 6.94 ± 0.61 | 7.09 ± 0.55 |
| C(with coating 3) | 2.46 ± 0.18 | 2.92 ± 0.27 | 3.82 ± 0.33 | / | / | / |
| D(uncoated) | 0.99 ± 0.07 | 1.34 ± 0.08 | 1.61 ± 0.12 | / | / | / |
| D(with coating 1) | 2.64 ± 0.19 | 3.09 ± 0.21 | 3.31 ± 0.26 | / | / | / |
| E(uncoated) | 0.75 ± 0.06 | 0.93 ± 0.08 | 1.20 ± 0.09 | / | / | / |
| E(with coating 1) | 2.59 ± 0.23 | 2.94 ± 0.26 | 3.13 ± 0.24 | / | / | / |
| F(uncoated) | 0.42 ± 0.02 | 0.44 ± 0.02 | 0.41 ± 0.02 | / | / | / |
| G(uncoated) | 0.37 ± 0.02 | 0.40 ± 0.03 | 0.39 ± 0.03 | 0.42 ± 0.02 | 0.43 ± 0.03 | 0.47 ± 0.03 |
| H(uncoated) | 0.33 ± 0.02 | 0.35 ± 0.02 | 0.37 ± 0.03 | 0.39 ± 0.02 | 0.43 ± 0.03 | 0.43 ± 0.03 |
| I(uncoated) | 0.99 ± 0.04 | 1.09 ± 0.03 | 1.23 ± 0.10 | 1.39 ± 0.10 | 1.48 ± 0.09 | 1.56 ± 0.06 |

Note:
A = flexible graphite (130 μm thick)
B = copper foil (13 μm thick)
C = aluminum foil (7 μm thick)
D = aluminum foil (130 μm thick)
E = copper foil (130 μm thick)
F = Dow Corning Heat Path (200 μm thick)
G = Chomerics Therm-A-Gap G580 (510 μm thick)
H = Chomerics Therm-A-Gap A580 (510 μm thick)
I = Thermagon T-pli 210 (250 μm thick)
Coating 1 = fluidic carbon black paste (based on polyethylene glycol, with 3 vol. % dissolved ethyl cellulose and 1.25 vol. % carbon black)
Coating 2 = thixotropic carbon black paste (based on polyol esters, with 2.4 vol. % carbon black)
Coating 3 = Arctic Silver 5 paste Whether for A, B, C, D or E, as defined above, the coating enhances the effectiveness substantially. The enhancement is more dramatic for the smooth surfaces than the rough surfaces, though it is significant for both. The enhancement is due to the increased conformability provided by the coating, as the thermal conductivity of the carbon black coating is less than that of copper or aluminum foil.

Coating 1 is more effective than coating 2, which is in turn more effective than coating 3, as shown for both A and C. For both rough and smooth surfaces, coating 1 is more effective than coating 2. This is due to the superior conformability of coating 1 compared to coating 2 (Example 10). The superiority of coating 1 over coating 2 is more dramatic for smooth surfaces than rough surfaces. Both coatings 1 and 2 are much more effective than coating 3. This is due to the inferior conformability of coating 3, which is considerably higher in viscosity than coating 1 or 2.

Of all the materials in Table 6, C (with coating 1) is most effective, whether the surfaces are rough or smooth, due to the combination of small thickness (provided by the thin aluminum foil) and the high conformability (provided by coating 1).

Comparison of C (uncoated) and D (uncoated) and comparison of B (uncoated) and E (uncoated) show that a smaller Among A, D and E (all uncoated, all the same thickness), A gives the highest conductance and E gives the lowest conductance. Among A, D and E (all coated with coating 1), A gives the highest conductance, while D and E are similar. E (uncoated) is less effective than D (uncoated), in spite of the high thermal conductivity of copper (E) compared to aluminum (D) and the equal thickness of these two foils. This means that a high thermal conductivity within the gap filling material does not necessarily result in a more effective gap filling material. In contrast, in the presence of coating 1, D and E are similar, indicating the significant effect of the coating.

The commercial gap filling materials F, G and H are the least effective of all the materials studied, in spite of their resiliency (which is due to the silicone). This is attributed partly to the thickness, which is larger than those of all the materials fabricated in this work. It is probably also due to the poor conformability of silicone. The commercial material I is superior to B (uncoated), E (uncoated), F, G and H. However, material I is inferior to most of the materials fabricated in this work.

For any of the materials studied, the use of smooth mating surfaces in place of rough ones increases the thermal contact conductance. This is due to the relatively small size of air pockets for the case of smooth surfaces.

Example 12

Application-Oriented Evaluation of Thermal Interface Materials Used for Improving the Thermal Contact between an Operating Computer Microprocessor and the Associated Heat Sink This example pertains to application-oriented evaluation of thermal contact enhancing interface materials. The application relates to improving the thermal contact between an operating computer microprocessor and the associated heat sink.

The thermal interface materials tested in this example are listed in Table 7, where FG is the flexible graphite of thickness 0.13 mm and Al is aluminum foil (1145) of thickness 7 vm. The aluminum foil was obtained from All-foils, Inc., Brooklyn Heights, Ohio. In addition, materials in the form of pastes were evaluated; they are carbon black (1.25 vol. %) polyethylene-glycol (with 3 vol. % dissolved ethyl cellulose) paste, Arctic Silver 5 (polyol ester filled with micronized silver particles, together with smaller quantities of submicron particles of boron nitride, zinc oxide and aluminum oxide, such that all the conductive fillers together make up 88 wt. % of the paste, from Arctic Silver Inc., Visalia, Calif.) and Shin-Etsu X-23-7762 (aluminum particle filled silicone from Shin-Etsu MicroSi, Inc., Phoenix, Ariz.). Flexible graphite and aluminum foil that had been coated with one of the pastes on both sides were also included in the comparative study.

TABLE 7

Temperature difference (° C., Column L) at 5 min of computer operation and thermal contact conductance ($10^4$ W/m$^2 \cdot$ ° C., Column M) for various thermal interface materials. FG = flexible graphite

| Thermal interface material | L | M* |
| --- | --- | --- |
| Carbon black | 3.32 ± 0.16 | 4.85 ± 0.13 |
| Arctic Silver | 4.30 ± 0.39 | 6.31 ± 0.39 |
| Shin-Etsu | 3.07 ± 0.53 | 7.41 ± 0.47 |
| FG | 6.55 ± 0.43 | 1.40 ± 0.09 |
| FG + carbon black | 3.67 ± 0.27 | 2.93 ± 0.09 |
| FG + Arctic Silver | 6.01 ± 0.55 | 1.74 ± 0.15 |
| FG + Shin-Etsu | 4.04 ± 0.58 | 2.63 ± 0.18 |
| Al | 6.63 ± 0.48 | 1.32 ± 0.06 |
| Al + carbon black | 3.92 ± 0.24 | 3.67 ± 0.31 |
| Al + Arctic Silver | 5.06 ± 0.44 | 2.46 ± 0.18 |
| Al + Shin-Etsu | 3.27 ± 0.35 | 4.59 ± 0.48 |

*Measured using the guarded hot plate method, with the thermal interface material between copper surfaces (15 μm roughness) squeezed together at a pressure of 0.46 MPa (50 psi).

The evaluation using the computer shows that the best materials are carbon black by itself, Shin-Etsu by itself and Al coated with Shin-Etsu, the second best materials are flexible graphite coated with carbon black or Shin-Etsu and Al coated with carbon black, the third best materials are Arctic Silver by itself and aluminum coated with Arctic Silver (Table 7). The superiority of carbon black and Shin-Etsu over Arctic Silver (each by itself) reflects the good alignment and smoothness (Example 14) of the mating surfaces and the consequent thin gap at the interface. The thin gap favors a thermal interface material that exhibits high conformability, in spite of a moderate thermal conductivity.

Figure 8:
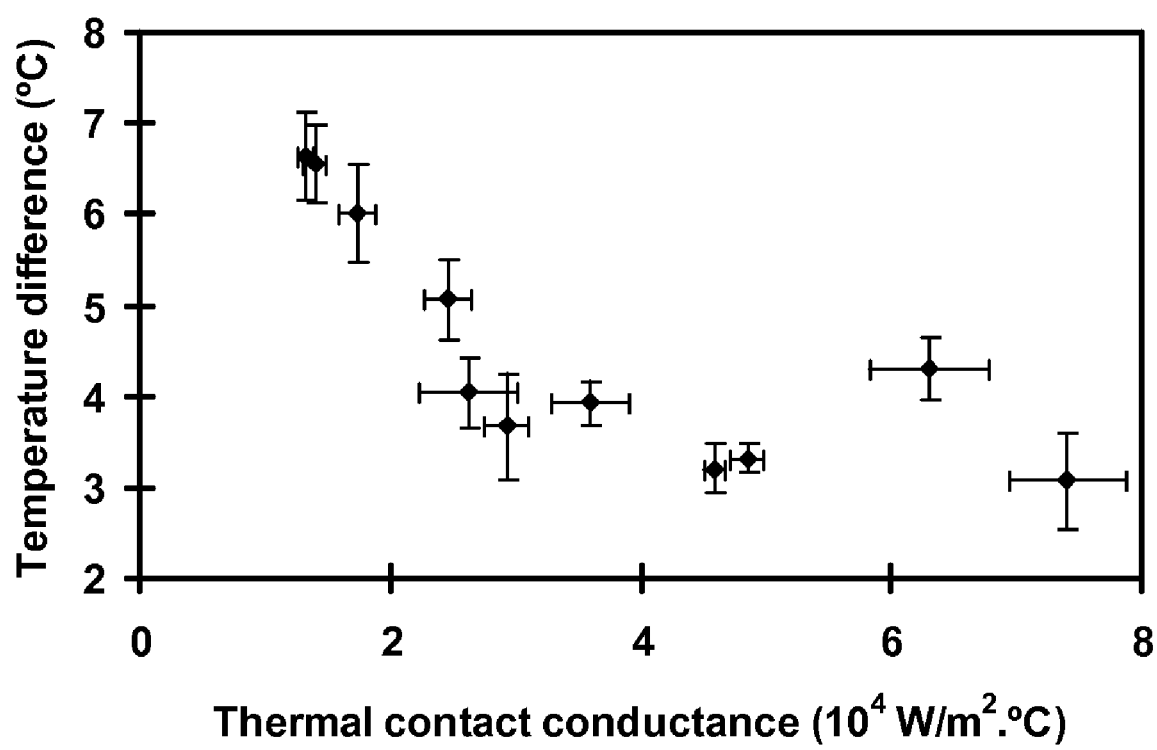
FIG. 8 is a graphical representation that shows the correlation of the temperature difference in application-oriented testing using a computer with the thermal contact conductance measured by the guarded hot plate method.

Table 7 shows results on the thermal contact conductance obtained using copper mating surfaces of roughness described in Example 14. A higher contact conductance should correspond to a lower temperature difference. FIG. 8 shows correlation between the results of computer testing and of thermal contact conductance measurement using the guarded hot plate method. Table 7 shows that a low value of the temperature difference correlates with a high value of the contact conductance in most cases. The main discrepancy pertains to the results for carbon black by itself and for Arctic Silver by itself. The temperature difference is lower for carbon black by itself than for Arctic Silver by itself, but the contact conductance is lower for carbon black by itself than for Arctic Silver by itself. This discrepancy is attributed to the greater smoothness of computer microprocessor package than the copper surfaces used in the contact conductance measurement (Example 14). The carbon black paste (with polyethylene glycol with dissolved ethyl cellulose as the vehicle) is more fluidic than Arctic Silver, so it has greater conformability, thus performing particularly well for smoother surfaces. The computer heat sink surface is rough, so conformability to the surface topography of the heat sink can be attained for both carbon black paste and Arctic Silver. However, conformability to the computer microprocessor surface is attained to a greater degree by the carbon black paste than Arctic Silver. The superiority of carbon black by itself to Arctic Silver by itself is consistent with measurement of the heat flux across copper mating surfaces that are smooth (roughness=0.05 vm) (Table 3).

The correlation shown in FIG. 8 is limited to the regime with conductance below $3 \times 10^4$ W/m$^2$.° C. (i.e., temperature difference above 4° C.). In this regime, a higher conductance is associated with a lower value of the temperature difference, as expected. In the remaining regime, the temperature difference is essentially independent of the conductance. For example, thermal contact conductance measurement shows that Shin-Etsu by itself is more effective than carbon black by itself, but the values of the temperature difference obtained by computer testing are close for these two cases (Table 7). This behavior is due to the fact that the thermocouples used in the computer testing are separated by not only the thermal interface material, but also the microprocessor package, the substrate and the socket (FIG. 4). The separation makes the measured temperature difference substantial even though the actual temperature difference across the mating surfaces may be small. Thus, the computer testing method is not suitable for evaluating high-performance thermal interface materials.

Example 13

Evaluation of Specific Heat

Figure 9:
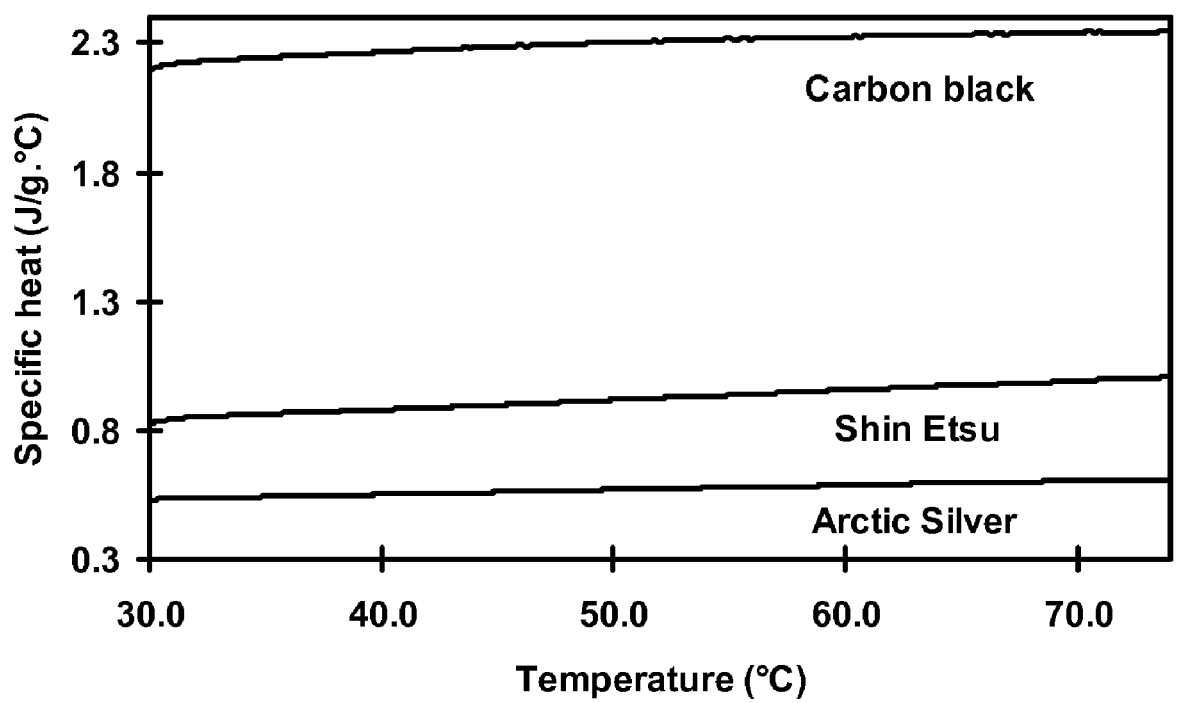
FIG. 9 is a graphic representation of the variation of the specific heat with temperature for each of three thermal pastes.

FIG. 9 shows the variation of the specific heat with temperature from 30 to 74° C. for the three thermal interface materials, namely (i) an optimized carbon black paste of this invention (1.25 vol. % carbon black in polyethylene glycol with 3 vol. % dissolved ethyl cellulose), (ii) Arctic Silver 5 (polyol ester filled with micronized silver particles, together with smaller quantities of submicron particles of boron nitride, zinc oxide and aluminum oxide, such that all the conductive fillers together make up 88 wt. % of the paste, from Arctic Silver Inc., Visalia, Calif.), and (iii) Shin-Etsu X-23-7762 (aluminum particle filled silicone from Shin-Etsu MicroSi, Inc., Phoenix, Ariz.).

Figure 7:
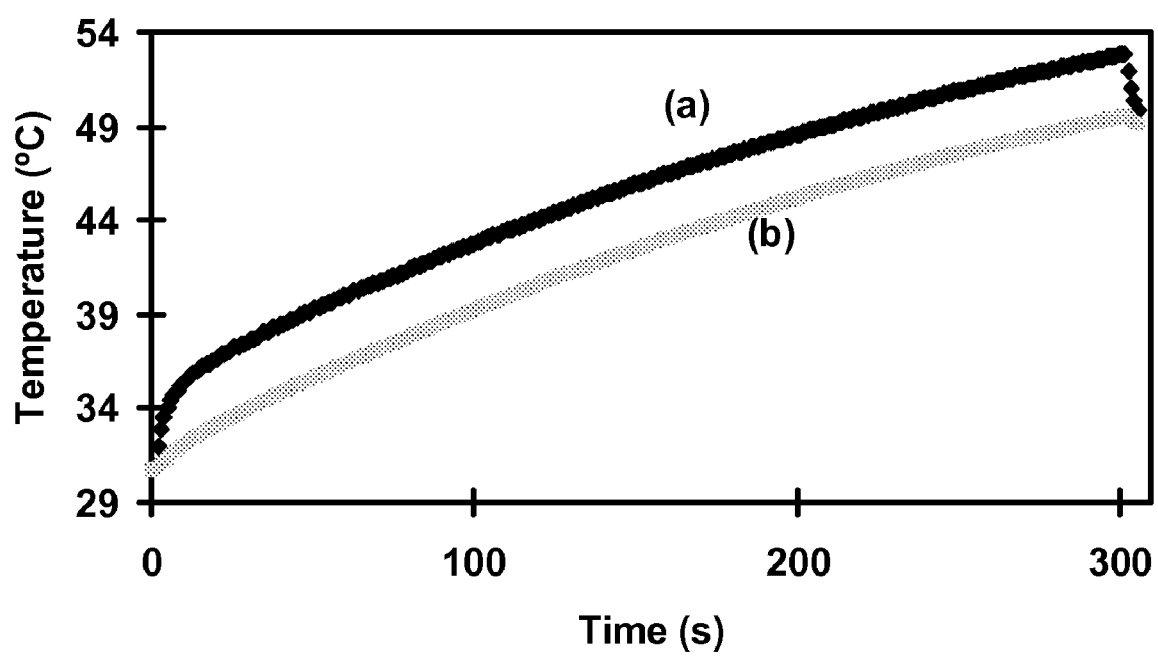
FIG. 7 is a graphic representation of the variation of temperature with the time of computer operation (up to 5 minutes) for application-oriented testing of the carbon black paste (with 1.25 vol. % carbon black, polyethylene-glycol and 3 vol. % dissolved ethyl cellulose) as a thermal interface material between the microprocessor and the heat sink of the computer. (a) Microprocessor temperature. (b) Heat sink temperature.

FIG. 7 shows the variation with time of the measured temperatures at microprocessor and heat sink, as recorded by the two thermocouples in FIG. 4 for the case with carbon black paste (with 1.25 vol. % carbon black, polyethylene-glycol and 3 vol. % dissolved ethyl cellulose) as the thermal interface material. The microprocessor was allowed to run for 5 min, after which it was turned off. Both temperatures increased monotonically with time, such that the microprocessor temperature was above the heat sink temperature, as expected. The maximum temperatures of the microprocessor and heat sink were 52.8 and 49.5° C. respectively.

The high volume fraction (96%) organic vehicle (polyethyleneglycol) in the carbon black paste explains why the specific heat is higher for this paste than the other two pastes, which contain a much lower volume fraction of the organic vehicle. A high value of the specific heat is attractive for absorbing the heat evolved by the heat sink. This absorption provides an additional mechanism of heat transfer.

The bulk thermal conductivity within a thermal interface material is to be distinguished from the thermal contact conductance, which describes the effectiveness of the thermal interface material in improving a thermal contact. The thermal conductivity values of the carbon black (with polyethylene glycol and dissolved ethyl cellulose as the vehicle), Arctic Silver and Shin Etsu pastes are shown in Table 8. As expected, the carbon black paste is much lower in thermal conductivity than the other two pastes. In spite of its low thermal conductivity, the carbon black paste outperforms the Arctic Silver paste (Example 12). Additionally, the carbon black paste performs similarly compared to the Shin Etsu paste (Example 12). These observations imply that the thermal conductivity within the thermal interface material is not the main factor that governs the performance of a thermal interface material.

against the grains than in the direction with the grains. The surface of the computer microprocessor package is relatively smooth. The two copper blocks used in the contact conductance measurement are rougher than the computer heat sink in the direction with the grains and are smoother than the computer heat sink in the direction against the grains. The roughness of the two copper blocks is close to 15 vm, which is the size of the abrasive particles used in the final stage of mechanical polishing of these surfaces.

TABLE 9

| Surface roughness (μm). | |
| --- | --- |
| Computer B heat sink (against grains) | 21.1 ± 0.7 |
| Computer B heat sink (with grains) | 12.0 ± 0.5 |
| Computer B microprocessor package | 8.3 ± 0.4 |
| Copper block (top) | 18.8 ± 0.8 |
| Copper block (bottom) | 14.3 ± 0.3 |

TABLE 8

Thermal properties of interface materials

| | Density (g/cm$^3$) | Thermal conductivity (W/m · K) | Specific heat (J/g · ° C.) | | |
| --- | --- | --- | --- | --- | --- |
| | | | 35° C. | 45° C. | 55° C. |
| Shin Etsu | 2.6$^a$ | 6.0$^a$ | 0.86 ± 0.04 | 0.89 ± 0.03 | 0.93 ± 0.01 |
| Arctic Silver | 4.05-4.15$^b$ | 8.4-9.0$^c$ | 0.54 ± 0.03 | 0.56 ± 0.02 | 0.58 ± 0.01 |
| Carbon black | 1.109 | 0.19-0.20$^d$ | 2.24 ± 0.03 | 2.29 ± 0.03 | 2.32 ± 0.04 |

$^a$http://www.microsi.com/packaging/data_sheets/DS % 20X23-7783D.pdf.
$^b$Arctic Silver 5; MSDS No. AS5; Arctic Silver Inc.: Visalia, CA, Oct. 10, 2003.
$^c$Estimated using previous generation products Arctic Silver II and 3 (http://www.arcticsilver-.com/as2.htm; http://www.arcticsilver.com/as3.htm).
$^d$Calculated using the Geometric Rule of Mixtures (Weber et al., J. Appl. Polym. Sci. 88, 123 (2003),. with the components being (i) carbon black (thermal conductivity 24 W/m · K, according to the website of Reade Advanced Materials, E. Providence, RI (http://www.reade.com/products/Carbons/carbon_black.html), (ii) ethyl cellulose (thermal conductivity 0.159-0.29 W/m · K (Avallone and Baumeister III, Marks' Standard Handbook for Mechanical Engineers(10th Ed.), (New York: McGraw-Hill, 1996), p. 6-189) and (iii) polyethylene glycol (molecular weight 400, thermal conductivity 0.183-0.185 W/m · K, as calculated based on the equation for the thermal conductivity of the homologous series of glycols (DiGuilio and Teja, J. Chem. Eng. Data 35, 117 (1990)).

Additional support of the low level of influence of the thermal conductivity within the thermal interface material on the performance is given by the observation that the use of carbon black paste alone and the use of Shin-Etsu in combination of aluminum foil give similar performance, as shown by both computer testing and thermal contact conductance measurement (Table 7), though the latter is obviously higher in thermal conductivity.

Example 14

Evaluation of Surface Roughness

Table 9 shows that the surface of the computer heat sink is quite rough, such that the roughness is greater in the direction Example 15

Evaluation of Conformability

TABLE 10

Conformability (as shown by the depth of penetration) and volume electrical resistivity of various thixotropic thermal pastes.
CB = carbon black.

| Filler | Penetration depth (mm) | Electrical resistivity (Ω · cm) |
| --- | --- | --- |
| 2.4 vol. % CB | 45.54 ± 0.53 | (3.2 ± 0.7) × 10$^3$ |
| 16.0 vol. % BN | 20.07 ± 0.56 | * |
| 10.7 vol. % graphite | 29.54 ± 1.07 | (1.32 ± 0.07) × 10$^5$ |

*Too high to be measured.

A high conformability is indicated by a large depth of penetration. As shown in Table 10, the conformability is highest for the carbon black paste, lowest for the BN paste and intermediate for the graphite paste. Correlation of the data in Tables 4 and 10 shows that a high thermal contact conductance indeed is associated with a high conformability. The penetration test could not be performed on fluidic pastes, such as those based on polyethylene glycol, due to the offscale (excessive) extent of penetration.

Example 16

Evaluation of Viscosity

Table 11 shows the viscosity of selected pastes, as measured at various appropriate shear rates. The addition of ethyl cellulose to either PEG or butyl ether monotonically increased the viscosity, as shown in the absence of carbon black. PEG alone was higher in viscosity than butyl ether alone. However, PEG with the optimum ethyl cellulose content of 3 vol. % was much lower in viscosity than butyl ether with the optimum ethyl cellulose content of 40 vol. %. The addition of carbon black monotonically increased the viscosity, as shown for PEG containing 3 vol. % ethyl cellulose and for butyl ether containing 40 vol. % ethyl cellulose.

invention that gave the highest thermal contact conductance. As shown in Table 11, although the two pastes gave similarly high values of the contact conductance, the butyl ether-based paste exhibited a much higher viscosity than the PEG-based paste.

Table 11 also shows that the viscosity of the butyl ether-based paste with 40 vol. % ethyl cellulose was lower when the paste contained 0.20 vol. % graphite particles (1 or 5 μm) or carbon filaments than when it contained 0.20 vol. % carbon black. However, it was noticed during paste mixing that the carbon black paste was much smoother than the graphite particle paste. The smoothness of the paste is apparently more important than the viscosity in governing thermal paste performance. Perhaps smoothness relates more closely to the conformability than a low viscosity.

Referring again to Table 11, the viscosity of butyl ether-based paste with 40 vol. % ethyl cellulose and 0.20 vol. % solid increased in the order: 1 μm graphite particles, 5 μm graphite particles and carbon filaments. This trend is consistent with the notion that a larger particle size tends to result in a paste with a higher viscosity and that filaments tend to result in a higher viscosity than particles.

Although the viscosity is a useful suggestive indicator of thermal paste performance, it is not the same as the conform-

TABLE 11

Viscosity (cP) at various shear rates ($s^{-1}$).

| | | | Viscosity (cP) | | | | | | |
|---|---|---|---|---|---|---|---|---|---|
| Vehicle | Vol. % EC | Vol. % CB | 0.79 ($s^{-1}$) | 2.0 ($s^{-1}$) | 2.6 ($s^{-1}$) | 4.0 ($s^{-1}$) | 6.6 ($s^{-1}$) | 7.9 ($s^{-1}$) | 16 ($s^{-1}$) | 40 ($s^{-1}$) |
| PEG | 0 | 0 | — | — | — | 125 | — | 120 | 120 | — |
| PEG | 3.0 | 0 | — | — | — | 160 | — | 145 | 140 | — |
| PEG | 5.0 | 0 | — | — | — | 190 | — | 190 | 195 | — |
| PEG | 7.5 | 0 | — | — | — | 240 | — | 250 | — | — |
| PEG | 3.0 | 0.50 | — | — | — | 175 | — | 185 | 185 | — |
| PEG | 3.0 | 1.25 | — | — | — | 200 | — | 195 | 200 | — |
| PEG | 3.0 | 1.50 | — | — | — | 210 | — | 210 | 215 | — |
| BE | 0 | 0 | — | — | — | — | — | — | — | <10 |
| BE | 10 | 0 | — | — | — | — | — | — | 25 | 20 |
| BE | 30 | 0 | 580 | 520 | — | 540 | — | — | — | — |
| BE | 40 | 0 | — | — | 4,000 | — | 3,900 | — | — | — |
| BE | 40 | 0.10 | — | — | 4,720 | — | 4,400 | — | — | — |
| BE | 40 | 0.20 | — | — | 5,200 | — | 4,800 | — | — | — |
| BE | 40 | 0.30 | — | — | 5,600 | — | 5,200 | — | — | — |
| BE | 40 | 0.20[a] | — | — | 4,000 | — | 3,900 | — | — | — |
| BE | 40 | 0.20[b] | — | — | 4,800 | — | 4,480 | — | — | — |
| BE | 40 | 0.20[c] | — | — | 5,000 | — | 4,720 | — | — | — |

EC = ethyl cellulose
CB = carbon black
BE = di(ethylene glycol) butyl ether
[a]Graphite particles (1 μm)
[b]Graphite particles (5 μm)
[c]Carbon filaments The PEG with 5 vol. % ethyl cellulose and the PEG-based paste containing 3 vol. % ethyl cellulose and 1.25 vol. % carbon black were similar in viscosity. The latter gave a higher contact conductance than the former, due to a decrease in the ethyl cellulose content and an increase in the carbon black content. Thus, adjustment of the contents of both ethyl cellulose and carbon black is needed in order to attain an optimized thermal paste formulation.

As shown in Table 1, the butyl-ether-based paste with 40 vol. % ethyl cellulose and 0.20 vol. % carbon black and the PEG-based paste with 3 vol. % ethyl cellulose and 1.25 vol. % carbon black are the two of the thermal pastes of the present ability, which is the attribute that really governs thermal paste performance. Since there is no standardized method of conformability measurement, this work resorted to viscosity measurement.

Example 17

Evaluation of Thermal Stability

Figure 10:
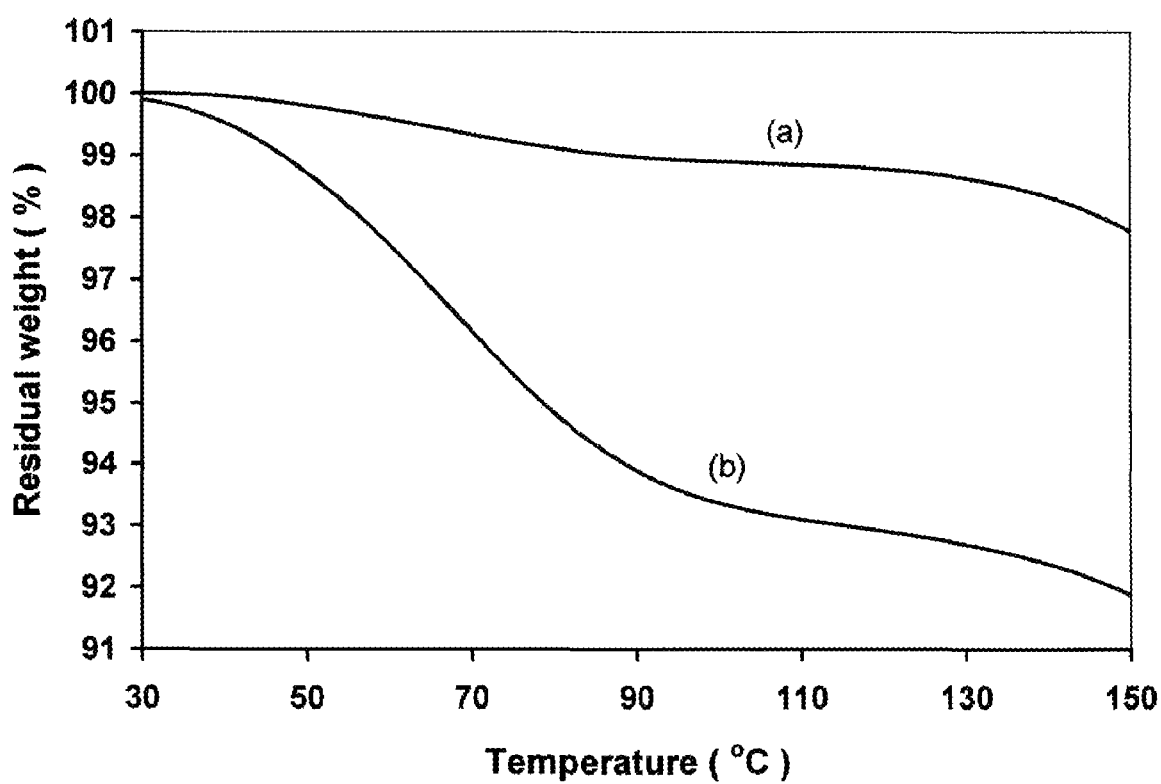
FIG. 10 is a graphic representation of thermogravimetric results obtained for (a) PEG by itself; and (b) PEG with 3 vol. % ethyl cellulose. The representation shows the residual weight (% of the initial weight) versus temperature (in ° C.).
Figure 11:
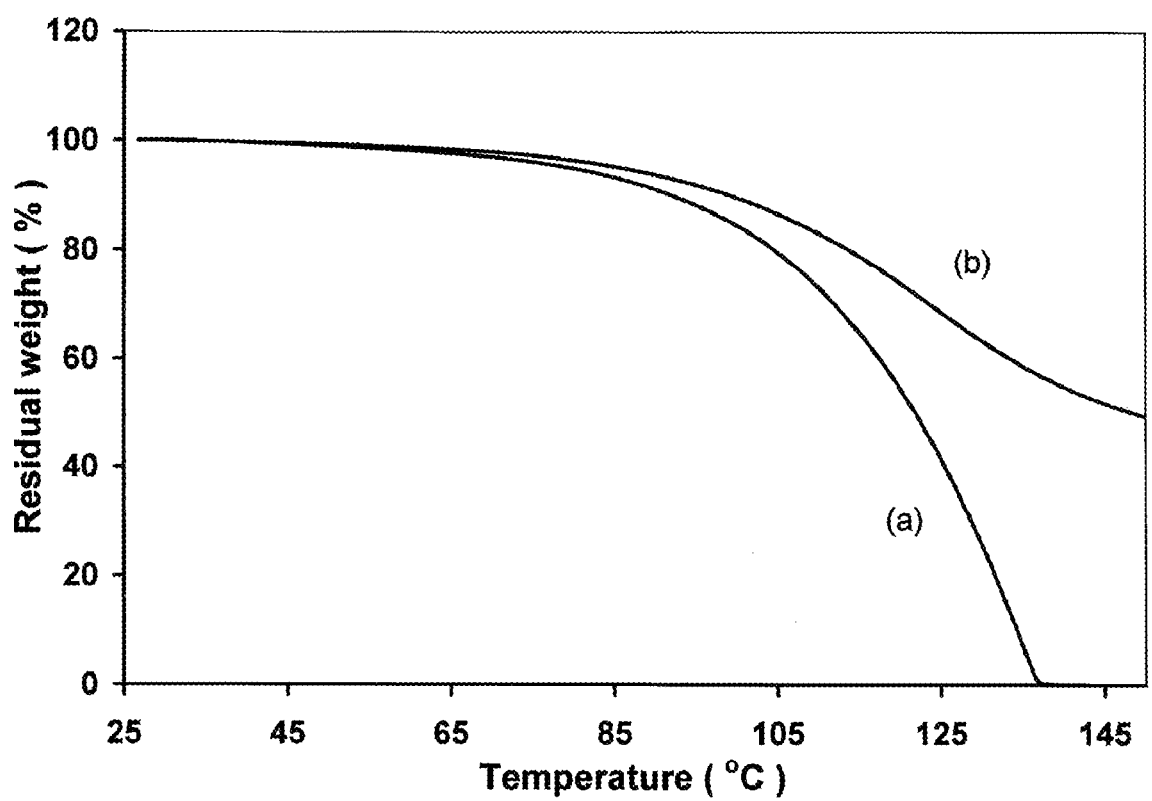
FIG. 11 is a graphic representation of thermogravimetric results obtained for (a) butyl ether by itself; and (b) butyl ether with 40 vol. % ethyl cellulose. The representation shows the residual weight (% of the initial weight) versus temperature (in ° C.).

FIGS. 10 and 11 respectively show the thermogravimetric results for PEG and butyl ether (with and without ethyl cellulose in each case, but without carbon black, which does not affect the thermal stability of the dispersion). Without ethyl cellulose, PEG is much more stable thermally than butyl ether. The dissolution of ethyl cellulose diminished the thermal stability of PEG, but increased that of butyl ether.

Table 12 shows a comparison of thermogravimetric results of these thermal pastes at three temperatures. At 50° C. and 75° C., butyl ether containing ethyl cellulose is more stable thermally than PEG containing ethyl cellulose, but at 100° C., the reverse is true. Above about 100° C., the weight loss of butyl ether, whether with or without ethyl cellulose, is extensive (more than 50% weight loss at 150° C.). However, the weight loss remains less than 9% even at 150° C. for PEG, whether with or without ethyl cellulose. Therefore, butyl ether-based pastes are not suitable for use above 100° C., whereas PEG-based pastes are suitable for use up to at least 150° C.

TABLE 12

| Thermal interface material | | Residual weight (%) | | |
|---|---|---|---|---|
| Vehicle | Vol. % EC | 50° C. | 75° C. | 100° C. |
| PEG | 0 | 99.81 | 99.22 | 98.91 |
| PEG | 3 | 98.73 | 95.47 | 93.36 |
| BE | 0 | 98.98 | 96.11 | 84.67 |
| BE | 40 | 99.33 | 97.26 | 89.68 |

EC = ethyl cellulose
PEG = polyethylene glycol
BE = di(ethylene glycol) butyl ether The thermal stability of the thermal pastes is expected to be much enhanced by the use of antioxidants that are dissolved in the vehicle. The results in Table 12 and FIGS. 10-13 were obtained in the absence of antioxidants.

Figure 12:
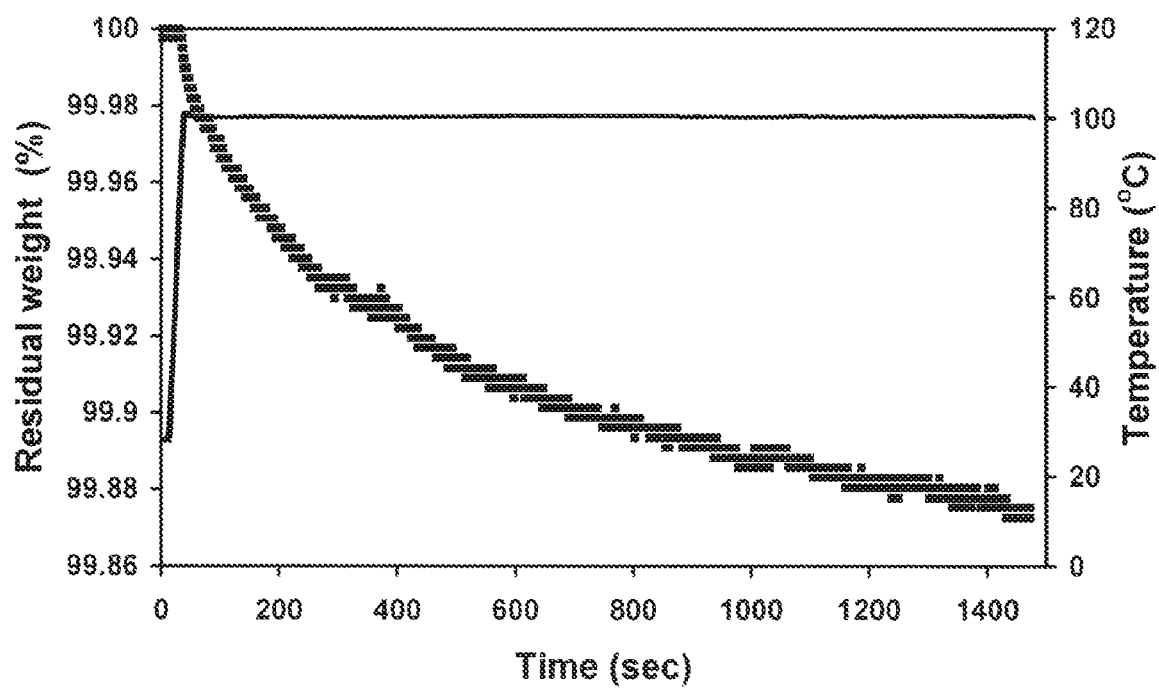
FIG. 12 is a graphic representation of thermogravimetric results obtained for a thixotropic paste with polyol esters as the vehicle and 2.4 vol. % carbon black. The thick curve shows the residual weight (% of the initial weight) versus time. The thin curve shows the temperature (in ° C.) versus time (in seconds).
Figure 13:
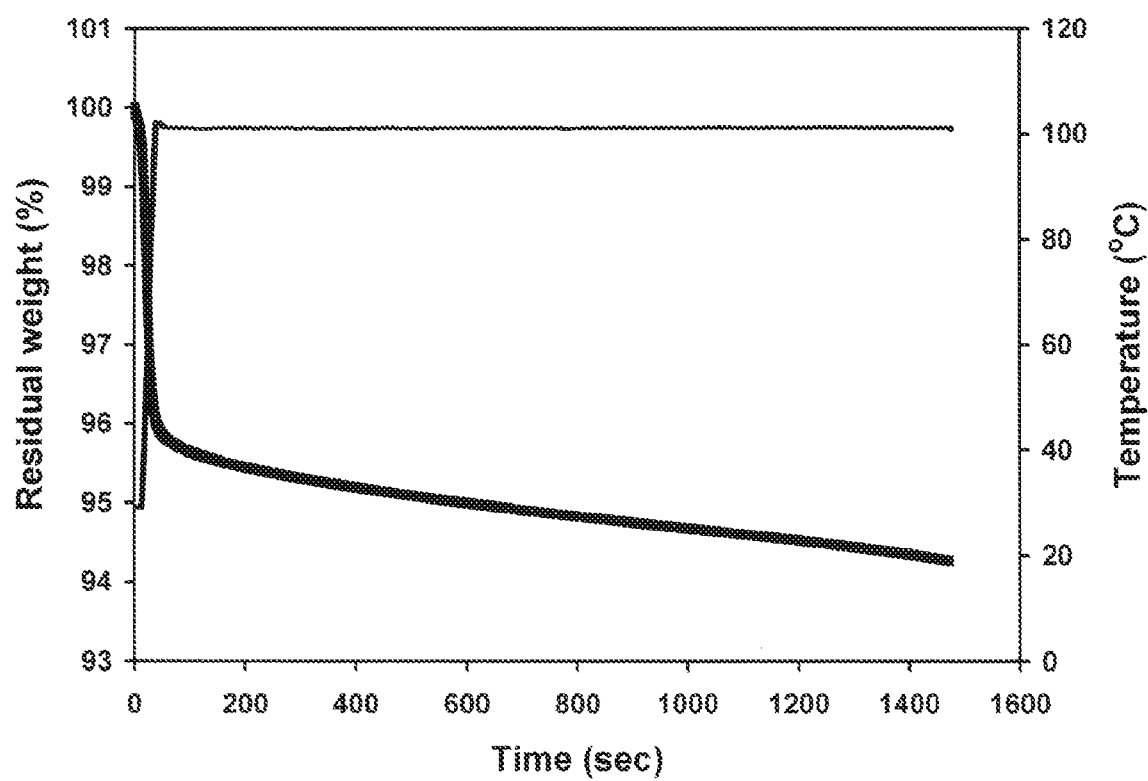
FIG. 13 is a graphic representation of thermogravimetric results obtained for a fluidic paste with polyethylene glycol (with 3 vol. % dissolved ethyl cellulose) as the vehicle and 1.25 vol. % carbon black. The thick curve shows the residual weight (% of the initial weight) versus time. The thin curve shows the temperature (in ° C.) versus time (in seconds).

FIGS. 12 and 13 show the residual weight versus time during the thermogravimetric analysis for the thixotropic paste (based on polyol esters, with 2.4 vol. % carbon black) and the fluidic paste (based on polyethylene glycol and containing 3 vol. % dissolved ethyl cellulose and 1.25 vol. % carbon black), respectively. Under the same heating schedule, the fractional weight loss reached 0.13% for the former and 5.5% for the latter. Thus, the polyol ester vehicle is superior in thermal stability to the PEG vehicle. This means that polyol esters are more thermally stable than the pastes addressed in Table 12 and FIGS. 10 and 11.

In summary, this invention's optimized fluidic carbon black pastes based on polyethylene glycol (PEG) or di(ethylene glycol) butyl ether, along with dissolved ethyl cellulose, provide thermal pastes that are superior to solder as thermal interface materials. The thermal contact conductance of the interface between copper disks reaches $3\times10^5$ W/m$^2$.° C., compared to $2\times10^5$ W/m$^2$.° C. for a tin-lead-antimony solder. The optimum carbon black paste based on PEG contains 3 vol. % dissolved ethyl cellulose and dispersed carbon black in the optimum amount of 1.25 vol. %. The optimum carbon black paste based on dibutyle ether contains 40 vol. % dissolved ethyl cellulose and dispersed carbon black in the optimum amount of 0.20 vol. %. The pastes based on PEG are superior to those based on butyl ether in their thermal stability above 100° C. Carbon black is superior to materials that are more conductive thermally (graphite, diamond and nickel particles, and carbon filaments) in providing thermal pastes of high performance. The performance of thermal pastes and solder as thermal interface materials is mainly governed by their conformability and spreadability rather than their thermal conductivity. The superiority of the formulations of the present invention to solder as thermal interface materials may presumably be due to the reaction between solder and copper and the consequent poor conformability of molten solder with copper.

The optimized carbon black pastes of this invention are superior to the best commercial silver and ceramic particle thermal pastes for providing high thermal contact conductance across mating surfaces that are smooth (0.05 vm). For mating surfaces that are rough (15 vm), the combined use of carbon black and silver is more effective than carbon, silver or ceramic pastes. The use of a silver paste to planarize the rough surfaces prior to using the carbon black dispersion is more effective than the use of a carbon-silver mixture. For both smooth and rough surfaces, the carbon-silver mixture is superior to silver pastes. The highest conductance attained for rough surfaces is lower than the highest attained for smooth surfaces.

This invention's optimized thixotropic carbon black paste based on polyol esters is comparable to this invention's optimized fluidic carbon black paste based on polyethylene glycol in its effectiveness as a thermal paste and in its dependence on pressure history. Prior pressure (up to 0.69 MPa) application helps. The optimum carbon black content is 2.4 vol. % for the thixotropic paste. The thermal contact conductance across copper surfaces is $3.0\times10^5$ and $1.1\times10^5$ W/m$^2$.° C. for surface roughness of 0.05 vm and 15 vm respectively. Boron nitride (5-11 vm) and graphite (5 vm) thixotropic pastes based on polyol esters are less effective than carbon black thixotropic paste by up to 70% and 25% respectively in thermal contact conductance, due to low conformability.

The optimized carbon black pastes of this invention are effective as coatings for improving the performance of thermal gap-filling materials, including flexible graphite, aluminum and copper. The thermal contact conductance across copper mating surfaces is increased by up to 180%. A fluidic form of carbon black paste (based on polyethylene glycol) is more effective than a thixotropic form (based on polyol esters). The carbon black pastes are much more effective as coatings than a commercial silver paste. With a carbon black paste coating, aluminum foil (7 μm thick) is a superior gap-filling material compared to similarly coated flexible graphite (130 μm thick). However, without a coating, flexible graphite is superior to aluminum. Commercial silicone-based gap-filling materials are inferior to flexible graphite or aluminum (whether coated or not).

As shown by measurement of the temperature rise of a computer microprocessor, an optimized carbon black paste of this invention, whether by itself or as a coating on aluminum or flexible graphite, is more effective than silver paste (Arctic Silver), but is comparable in effectiveness to aluminum paste (Shin-Etsu). The carbon black paste by itself is as effective as the Shin-Etsu paste coated aluminum. The Shin-Etsu paste is more effective than Arctic Silver, whether by itself or as a coating. The relative performance is assessed by measurement of the temperature rise of a computer microprocessor is mostly consistent with that assessed by measuring the thermal contact conductance. The correlation is particularly strong for conductance below $3\times10^4$ W/m$^2$.° C. The discrepancy is attributed to the difference in surface roughness between computer and guarded hot plate surfaces.

Although preferred embodiments have been depicted and described in detail herein, it will be apparent to those skilled in the relevant art that various additions, substitutions, modifications and the like can be made without departing from the spirit of the invention and these are therefore considered to be within the scope of the invention as defined in the claims which follow.

What is claimed:

1. A thermal contact enhancing interface material comprising: a conformable, spreadable and thermally conductive paste comprising porous agglomerates of carbon black dispersed in a paste-forming vehicle, wherein the paste, upon contact with and consolidation between two solid surfaces, forms a material that
   a. substantially conforms to the topography of said surfaces, and
   b. enhances the thermal contact between said surfaces, said consolidation and said conforming being substantially enabled by the compressibility of said agglomerates.

2. The thermal contact enhancing interface material of claim 1, wherein the paste, upon said consolidation, is less than about 100 μm thick in a direction essentially perpendicular to the plane of said thermal contact.

3. The thermal contact enhancing interface material of claim 1, wherein the degree of said consolidation is up to the consolidation degree attained by applying to said paste a pressure equal to about 1 MPa in a direction essentially perpendicular to the plane of said thermal contact.

4. The thermal contact enhancing interface material of claim 1, wherein each of the agglomerates comprises carbon particles of particle size less than about 100 nm.

5. The thermal contact enhancing interface material of claim 1, wherein the paste-forming vehicle is an organic liquid selected from the group consisting of polyol ester, pentaerythritol ester of linear and branched fatty acids, dipentaerythritol ester of linear and branched fatty acids, a mixture of polyol esters, polyethylene glycol, polyethylene glycol with dissolved ethyl cellulose, di(ethylene glycol) butyl ether and di(ethylene glycol) butyl ether with dissolved ethyl cellulose.

6. The thermal contact enhancing interface material of claim 1, wherein the paste-forming vehicle comprises polyethylene glycol of molecular weight less than about 1,000 amu.

7. The thermal contact enhancing interface material of claim 1, wherein the amount of carbon black dispersed in the paste is less than about 20 vol. %.

8. A thermal contact enhancing interface material which, upon contact with and consolidation between two solid surfaces, forms a material that
   (i) substantially conforms to the topography of said surfaces, and
   (ii) enhances the thermal contact between said surfaces, said material comprising
      (a) a sheet, and
      (b) a conformable, spreadable and thermally conductive paste on each of the two opposite sides of said sheet, said paste comprising porous agglomerates of carbon black dispersed in a paste-forming vehicle,
said consolidation and said conforming being substantially enabled by the compressibility of said agglomerates.

9. A thermal contact enhancing interface material of claim 8, wherein said sheet comprises a thermally conductive material selected from the group consisting of aluminum, copper, steel, brass, bronze, silver, gold, titanium, tungsten, molybdenum, graphite, flexible graphite, carbon fiber, diamond, metal coated polymer and metal coated glass.

10. A thermal contact enhancing interface material of claim 8, wherein said paste, upon said consolidation, is less than about 100 μm thick in a direction essentially perpendicular to the plane of said thermal contact.

11. The thermal contact enhancing interface material of claim 8, wherein the degree of said consolidation is up to the consolidation degree attained by applying to said paste a pressure equal to about 1 MPa in a direction essentially perpendicular to the plane of said thermal contact.

12. A thermal contact enhancing interface material of claim 8, wherein each of the agglomerates comprises carbon particles of particle size less than about 100 nm.

13. The thermal contact enhancing interface material of claim 8, wherein the paste-forming vehicle is an organic liquid selected from the group consisting of polyol ester, pentaerythritol ester of linear and branched fatty acids, dipentaerythritol ester of linear and branched fatty acids, a mixture of polyol esters, polyethylene glycol, polyethylene glycol with dissolved ethyl cellulose, di(ethylene glycol) butyl ether and di(ethylene glycol) butyl ether with dissolved ethyl cellulose.

14. The thermal contact enhancing interface material of claim 8, wherein the paste-forming vehicle comprises polyethylene glycol of molecular weight less than about 1,000 amu.

15. The thermal contact enhancing interface material of claim 8, wherein the amount of carbon black dispersed in the paste is less than about 20 vol. %.

16. Method of providing a thermal contact between two solid surfaces, said method comprising
   a. disposing between and in contact with said surfaces a material comprising: a conformable, spreadable and thermally conductive paste comprising porous agglomerates of carbon black dispersed in a paste-forming vehicle, and
   b. applying a pressure that is sufficient to cause said material to substantially conform to the topography of said surfaces,
said conforming being substantially enabled by the compressibility of said agglomerates.

17. Method of claim 16, wherein said paste, when subjected to said pressure, is less than about 100 μm thick in a direction essentially perpendicular to the plane of said thermal contact.

18. Method of claim 16, wherein said pressure is less than about 1 MPa.

19. Method of claim 16, wherein each of the agglomerates comprises carbon particles of particle size less than about 100 nm.

20. Method of claim 16, wherein the paste-forming vehicle is an organic liquid selected from the group consisting of polyol ester, pentaerythritol ester of linear and branched fatty acids, dipentaerythritol ester of linear and branched fatty acids, a mixture of polyol esters, polyethylene glycol, polyethylene glycol with dissolved ethyl cellulose, di(ethylene glycol) butyl ether and di(ethylene glycol) butyl ether with dissolved ethyl cellulose.

* * * * *